US012206432B2

(12) United States Patent
Todorokihara

(10) Patent No.: US 12,206,432 B2
(45) Date of Patent: Jan. 21, 2025

(54) FREQUENCY SYNTHESIZER

(71) Applicant: SEIKO EPSON CORPORATION, Tokyo (JP)

(72) Inventor: Masayoshi Todorokihara, Suwa (JP)

(73) Assignee: SEIKO EPSON CORPORATION (JP)

(*) Notice: Subject to any disclaimer, the term of this patent is extended or adjusted under 35 U.S.C. 154(b) by 203 days.

(21) Appl. No.: 18/088,902

(22) Filed: Dec. 27, 2022

(65) Prior Publication Data
US 2023/0208433 A1   Jun. 29, 2023

(30) Foreign Application Priority Data
Dec. 28, 2021   (JP) .................. 2021214072

(51) Int. Cl.
H03M 1/82    (2006.01)
G06F 7/02    (2006.01)
G06F 7/50    (2006.01)
H03L 7/197   (2006.01)

(52) U.S. Cl.
CPC ............. *H03M 1/825* (2013.01); *G06F 7/02* (2013.01); *G06F 7/50* (2013.01); *H03L 7/197* (2013.01)

(58) Field of Classification Search
CPC .. H03M 1/825; G06F 7/02; G06F 7/50; H03L 7/197
See application file for complete search history.

(56) References Cited

U.S. PATENT DOCUMENTS 8,666,012 B2*   3/2014   Vilander ................. H03L 7/113
                                                              708/271
10,018,970 B2*  7/2018   Chuang ................. G04F 10/005

FOREIGN PATENT DOCUMENTS

JP   2017-092833 A   5/2017

* cited by examiner

*Primary Examiner* — Khai M Nguyen
(74) *Attorney, Agent, or Firm* — Harness, Dickey & Pierce, P.L.C.

(57) ABSTRACT

A frequency synthesizer includes: a time-to-digital converter configured to output a time-to-digital value corresponding to a time event of a trigger signal with respect to an operating clock signal; a comparison unit configured to compare a value based on the time-to-digital value with a target value; an oscillation unit configured to generate the synthesizer signal; and a frequency adjustment unit configured to adjust a frequency of the synthesizer signal based on a comparison result of the comparison unit. The time-to-digital converter includes: a state transition unit configured to start a state transition in which an internal state transitions based on the time event of the trigger signal and output state information indicating the internal state; a transition state acquisition unit configured to acquire and hold the state information in synchronization with the operating clock signal; and a calculation unit configured to calculate the time-to-digital value according to the number of transition times of the internal state based on the state information acquired by the transition state acquisition unit.

10 Claims, 11 Drawing Sheets

| PD | RCLK edge No. | 0 | 1 | 2 | 3 | 4 | 5 | 6 | 7 | 8 | 9 | 10 | 11 | 12 |
|---|---|---|---|---|---|---|---|---|---|---|---|---|---|---|
| T×0.5 | DCNT | 0 | 4 | 12 | 20 | 29 | 37 | 45 | 53 | 62 | 64 | 64 | 64 | 64 |
| | TD | 0 | 64 | 124 | 176 | 220 | 255 | 282 | 301 | 312 | 314 | 314 | 314 | 314 |
| T×0.7 | DCNT | 0 | 2 | 10 | 19 | 27 | 35 | 43 | 51 | 60 | 64 | 64 | 64 | 64 |
| | TD | 0 | 64 | 126 | 180 | 225 | 262 | 291 | 312 | 325 | 329 | 329 | 329 | 329 |
| T×1.5 | DCNT | 0 | 0 | 4 | 12 | 20 | 29 | 37 | 45 | 53 | 62 | 64 | 64 | 64 |
| | TD | 0 | 64 | 128 | 188 | 240 | 284 | 319 | 346 | 365 | 376 | 378 | 378 | 378 |
| T×1.7 | DCNT | 0 | 0 | 2 | 10 | 19 | 27 | 35 | 43 | 51 | 60 | 64 | 64 | 64 |
| | TD | 0 | 64 | 128 | 190 | 244 | 289 | 326 | 355 | 376 | 389 | 393 | 393 | 393 |

*FIG. 12*

| RCLK edge No. | S0, S1, S2, ···, S61, S62, S63 | CNTX | CNT | ACNT | WC | TD |
|---|---|---|---|---|---|---|
| 1 | 0000000000000000000000000000000000000000000000000000000000000000 | 0 | 64 | 0 | 0 | 0 |
| 2 | 1111000000000000000000000000000000000000000000000000000000000000 | 4 | 4 | 0 | 64 | 64 |
| 3 | 1111111111110000000000000000000000000000000000000000000000000000 | 12 | 12 | 4 | 128 | 124 |
| 4 | 1111111111111111111100000000000000000000000000000000000000000000 | 20 | 20 | 16 | 192 | 176 |
| 5 | 1111111111111111111111111111100000000000000000000000000000000000 | 29 | 29 | 36 | 256 | 220 |
| 6 | 1111111111111111111111111111111111100000000000000000000000000000 | 37 | 37 | 65 | 320 | 255 |
| 7 | 1111111111111111111111111111111111111111111000000000000000000000 | 45 | 45 | 102 | 384 | 282 |
| 8 | 1111111111111111111111111111111111111111111111111110000000000000 | 53 | 53 | 147 | 448 | 301 |
| 9 | 1111111111111111111111111111111111111111111111111111111111111100 | 62 | 62 | 200 | 512 | 312 |
| 10 | 1111111111111111111111111111111111111111111111111111111111111111 | 64 | 64 | 262 | 576 | 314 |
| 11 | 1111111111111111111111111111111111111111111111111111111111111111 | 64 | 64 | 326 | 640 | 314 |
| 12 | 1111111111111111111111111111111111111111111111111111111111111111 | 64 | 64 | 390 | 704 | 314 |
| 13 | 0011111111111111111111111111111111111111111111111111111111111111 | 62 | 2 | 0 | 768 | 768 |
| 14 | 0000000000111111111111111111111111111111111111111111111111111111 | 54 | 10 | 2 | 832 | 830 |
| 15 | 0000000000000000011111111111111111111111111111111111111111111111 | 45 | 19 | 12 | 896 | 884 |
| 16 | 0000000000000000000000000111111111111111111111111111111111111111 | 37 | 27 | 31 | 960 | 929 |
| 17 | 0000000000000000000000000000000000011111111111111111111111111111 | 29 | 35 | 58 | 1024 | 966 |
| 18 | 0000000000000000000000000000000000000000011111111111111111111111 | 21 | 43 | 93 | 1088 | 995 |
| 19 | 0000000000000000000000000000000000000000000000000011111111111111 | 13 | 51 | 136 | 1152 | 1016 |
| 20 | 0000000000000000000000000000000000000000000000000000000000001111 | 4 | 60 | 187 | 1216 | 1029 |
| 21 | 0000000000000000000000000000000000000000000000000000000000000000 | 0 | 64 | 247 | 1280 | 1033 |
| 22 | 0000000000000000000000000000000000000000000000000000000000000000 | 0 | 64 | 311 | 1344 | 1033 |
| 23 | 0000000000000000000000000000000000000000000000000000000000000000 | 0 | 64 | 375 | 1408 | 1033 |
| 24 | 1000000000000000000000000000000000000000000000000000000000000000 | 1 | 1 | 0 | 1472 | 1472 |
| 25 | 1111111110000000000000000000000000000000000000000000000000000000 | 9 | 9 | 1 | 1536 | 1535 |
| 26 | 1111111111111111100000000000000000000000000000000000000000000000 | 17 | 17 | 10 | 1600 | 1590 |
| 27 | 1111111111111111111111111100000000000000000000000000000000000000 | 26 | 26 | 27 | 1664 | 1637 |
| 28 | 1111111111111111111111111111111111000000000000000000000000000000 | 34 | 34 | 53 | 1728 | 1675 |

FIG. 14

| S0, S1, S2, ..., S61, S62, S63 | $\Sigma_{10}$ | $\Sigma_{01}$ | $\Sigma_{10}$ | $\Sigma_{01}$ | $\Sigma_i$ | $\Sigma_j$ | $\Sigma A$ | $\Sigma A$ | WC | $TD_i$ | $TD_j$ | TD |
|---|---|---|---|---|---|---|---|---|---|---|---|---|
| 0000000000000000000000000000000001111111111111111111111111111111 | 25 | 25 | 39 | 39 | 64 | 39 | 357 | 73 | 768 | 411 | 695 | 75 |
| 1111000000000000000000000000000000000000000001111111111111111111 | 47 | 60 | 47 | 4 | 4 | 47 | 0 | 112 | 832 | 832 | 720 | |
| 1111111111000000000000000000000000000000000000000000001111111111 | 55 | 52 | 55 | 12 | 12 | 55 | 4 | 159 | 896 | 892 | 737 | |
| 1111111111111111110000000000000000000000000000000000000000000000 | 20 | 20 | 20 | 20 | 20 | 64 | 16 | 214 | 960 | 944 | 746 | 411 |
| 1111111111111111111111111000000000000000000000000000000000000000 | 29 | 29 | 29 | 29 | 29 | 64 | 36 | 278 | 1024 | 988 | 746 | |
| 1111111111111111111111111111111110000000000000000000000000000000 | 37 | 37 | 37 | 37 | 37 | 64 | 65 | 342 | 1088 | 1023 | 746 | |
| 0011111111111111111111111111111111111111110000000000000000000000 | 45 | 62 | 45 | 2 | 45 | 2 | 102 | 0 | 1152 | 1050 | 1152 | |
| 0000000001111111111111111111111111111111111111111110000000000000 | 53 | 54 | 53 | 10 | 53 | 10 | 147 | 2 | 1216 | 1069 | 1214 | |
| 0000000000000000011111111111111111111111111111111111111111111100 | 62 | 45 | 62 | 19 | 62 | 19 | 200 | 12 | 1280 | 1080 | 1268 | 746 |
| 0000000000000000000000000111111111111111111111111111111111111111 | 37 | 37 | 27 | 27 | 64 | 27 | 262 | 31 | 1344 | 1082 | 1313 | |
| 0000000000000000000000000000000001111111111111111111111111111111 | 29 | 29 | 35 | 35 | 64 | 35 | 326 | 58 | 1408 | 1082 | 1350 | |
| 1000000000000000000000000000000000000000000001111111111111111111 | 43 | 63 | 43 | 1 | 1 | 43 | 0 | 93 | 1472 | 1472 | 1379 | |
| 1111111100000000000000000000000000000000000001111111111111111111 | 51 | 55 | 51 | 9 | 9 | 51 | 1 | 136 | 1536 | 1535 | 1400 | |
| 1111111111111111000000000000000000000000000000000000000000001111 | 60 | 47 | 60 | 17 | 17 | 60 | 10 | 187 | 1600 | 1590 | 1413 | 1082 |
| 1111111111111111111111111000000000000000000000000000000000000000 | 26 | 26 | 26 | 26 | 26 | 64 | 27 | 247 | 1664 | 1637 | 1417 | |
| 1111111111111111111111111111111110000000000000000000000000000000 | 34 | 34 | 34 | 34 | 34 | 64 | 53 | 311 | 1728 | 1675 | 1417 | |

FREQUENCY SYNTHESIZER

The present application is based on, and claims priority from JP Application Serial Number 2021-214072, filed Dec. 28, 2021, the disclosure of which is hereby incorporated by reference herein in its entirety.

BACKGROUND

1. Technical Field

The present disclosure relates to a frequency synthesizer.

2. Related Art

JP-A-2017-92833 describes a frequency synthesizer including: a frequency delta-sigma modulation unit that measures a frequency ratio between a clock signal output from a voltage-controlled oscillator and an operating clock signal; a frequency comparator that compares a target value of a frequency with a frequency indicated by a signal obtained by multiplying an output signal of the frequency delta-sigma modulation unit by k; an integration unit that integrates a signal obtained by multiplying an output signal of the frequency comparator by k0; a digital-to-analog converter that converts a digital signal output from the integration unit into an analog signal; and the voltage controlled oscillator that generates a clock signal having a frequency corresponding to a voltage of an output signal of the digital-to-analog converter. According to this frequency synthesizer, time required for locking a frequency or a phase of the clock signal can be reduced, and an idle tone can be limited even when there is a fluctuation in the clock signal during locking.

However, in the frequency synthesizer described in JP-A-2017-92833, in order to accurately measure the frequency ratio between the clock signal and the operating clock signal to generate a high-accuracy clock signal, it is necessary to provide a large number of frequency delta-sigma modulation units in parallel, and a circuit scale significantly increases.

SUMMARY

A frequency synthesizer according to an aspect of the present disclosure includes: a time-to-digital converter configured to output, when a reference period signal and a synthesizer signal are input, and a signal having a shorter period is used as an operating clock signal and a signal having a longer period is used as a trigger signal among the reference period signal and the synthesizer signal, a time-to-digital value corresponding to a time event of the trigger signal with respect to the operating clock signal; a comparison unit configured to compare a value based on the time-to-digital value output from the time-to-digital converter with a target value; an oscillation unit configured to generate the synthesizer signal; and a frequency adjustment unit configured to adjust a frequency of the synthesizer signal based on a comparison result of the comparison unit, in which the time-to-digital converter includes: a state transition unit configured to start a state transition in which an internal state transitions based on the time event of the trigger signal and output state information indicating the internal state; a transition state acquisition unit configured to acquire and hold the state information from the state transition unit in synchronization with the operating clock signal; and a calculation unit configured to calculate the time-to-digital value according to the number of transition times of the internal state based on the state information acquired by the transition state acquisition unit.

BRIEF DESCRIPTION OF THE DRAWINGS

FIG. 12 is a timing chart showing an example of an operation timing of the time-to-digital converter according to the second embodiment.

FIG. 14 is a diagram showing an example of a relationship among a signal S[63: 0], each count value, each integrated value, each weight coefficient value, and each time-to-digital value.

DESCRIPTION OF EXEMPLARY EMBODIMENTS

Hereinafter, preferred embodiments of the present disclosure will be described in detail with reference to the drawings. The embodiments described below do not in any way limit contents of the present disclosure described in claims. Not all configurations described below are necessarily essential components of the present disclosure.

1. First Embodiment

1-1. Configuration and Operation of Frequency Synthesizer

Figure 1:
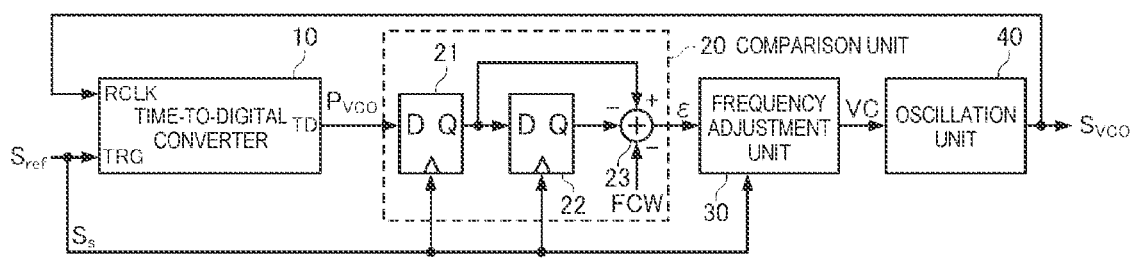
FIG. 1 is a block diagram showing a configuration example of a frequency synthesizer according to a first embodiment.
Figure 2:
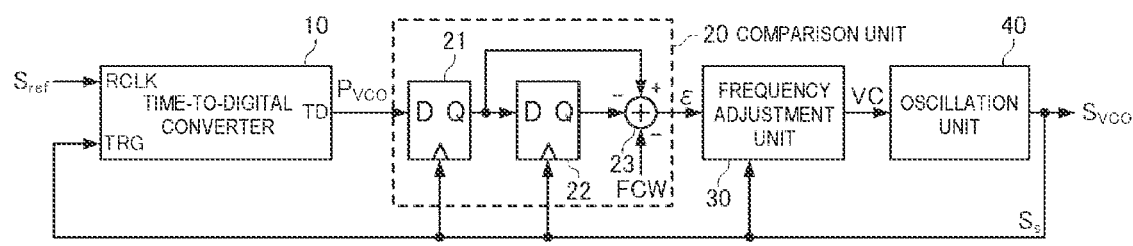
FIG. 2 is a block diagram showing another configuration example of the frequency synthesizer according to the first embodiment.

FIG. 1 is a block diagram showing a configuration example of a frequency synthesizer according to a first embodiment. FIG. 2 is a block diagram showing another configuration example of the frequency synthesizer according to the first embodiment. As shown in FIGS. 1 and 2, a frequency synthesizer 1 according to the first embodiment includes a time-to-digital converter 10, a comparison unit 20, a frequency adjustment unit 30, and an oscillation unit 40.

The time-to-digital converter 10 outputs, when a reference period signal $S_{ref}$ and a synthesizer signal $S_{VCO}$ are input, and a signal having a shorter period is used as an operating clock signal RCLK and a signal having a longer period is used as a trigger signal TRG among the reference period signal $S_{ref}$ and the synthesizer signal $S_{VCO}$ output from the oscillation unit 40, a time-to-digital value TD corresponding to a time event of the trigger signal TRG with respect to the operating clock signal RCLK. The reference period signal $S_{ref}$ may be, for example, a signal input from an outside of the frequency synthesizer 1, or may be a signal generated by an oscillation circuit (not shown) of the frequency synthesizer 1.

In the example of FIG. 1, the signal having a shorter period is the synthesizer signal $S_{VCO}$ and the signal having a longer period is the reference period signal $S_{ref}$ among the reference period signal $S_{ref}$ and the synthesizer signal $S_{VCO}$. Therefore, the time-to-digital converter 10 outputs the time-to-digital value TD when the synthesizer signal $S_{VCO}$ is used as the operating clock signal RCLK and the reference period signal $S_{ref}$ is used as the trigger signal TRG. Conversely, in the example of FIG. 2, the signal having the shorter period is the reference period signal $S_{ref}$ and the signal having the longer period is the synthesizer signal $S_{VCO}$ among the reference period signal $S_{ref}$ and the synthesizer signal $S_{VCO}$. Therefore, the time-to-digital converter 10 outputs the time-to-digital value TD when the reference period signal $S_{ref}$ is used as the operating clock signal RCLK and the synthesizer signal $S_{VCO}$ is used as the trigger signal TRG.

In the present embodiment, the time-to-digital converter 10 functions as a phase detection unit that outputs a time-to-digital value TD corresponding to a phase difference between a time event of the operating clock signal RCLK and a time event of the trigger signal TRG. The time event of the trigger signal TRG is a timing at which the trigger signal TRG changes, may be, for example, a rising edge or a falling edge of the trigger signal TRG, or may be a rising edge and a falling edge of the trigger signal TRG. Similarly, the time event of the operating clock signal RCLK is a timing at which the operating clock signal RCLK changes, may be, for example, a rising edge or a falling edge of the operating clock signal RCLK, or may include a rising edge and a falling edge of the operating clock signal RCLK.

A detailed configuration example of the time-to-digital converter 10 will be described later.

The time-to-digital value TD output from the time-to-digital converter 10 is input to the comparison unit 20 as a phase signal $P_{VCO}$. The comparison unit 20 compares a value based on the time-to-digital value TD, which is the phase signal $P_{VCO}$, with a target value, and outputs an error signal ε, which is a comparison result. In the present embodiment, the comparison unit 20 compares a change amount of the time-to-digital value TD with a set value FCW, and outputs, as a comparison result, a difference between the change amount of the time-to-digital value TD and the set value FCW as the error signal ε. That is, in the present embodiment, the value based on the time-to-digital value TD, which is one comparison target by the comparison unit 20, is the change amount of the time-to-digital value TD, and the target value, which is the other comparison target, is the set value FCW. The set value FCW is, for example, a value determined based on a multiplication ratio or a division ratio set in advance, may be a value of the signal input from the outside of the frequency synthesizer 1, or may be a value obtained by reading data stored in advance in a storage unit (not shown) of the frequency synthesizer 1.

As shown in FIGS. 1 and 2, for example, the comparison unit 20 includes a latch circuit 21 including a plurality of D flip-flops, a latch circuit 22 including a plurality of other D flip-flops, and an adder-subtractor 23. The latch circuits 21 and 22 operate by using the signal having a longer period among the reference period signal $S_{ref}$ and the synthesizer signal $S_{VCO}$ as a sampling signal $S_s$. The sampling signal $S_s$ input to the latch circuits 21 and 22 is the reference period signal $S_{ref}$ in the example of FIG. 1, and is the synthesizer signal $S_{VCO}$ in the example of FIG. 2. The latch circuit 21 captures and holds the time-to-digital value TD, which is the phase signal $P_{VCO}$, in synchronization with a rising edge of the sampling signal $S_s$. The latch circuit 22 captures and holds a signal held by the latch circuit 21 in synchronization with the rising edge of the sampling signal $S_s$. The latch circuits 21 and 22 may operate in synchronization with a falling edge of the sampling signal $S_s$. The adder-subtractor 23 outputs an error signal ε corresponding to a difference between the signal held by the latch circuit 21 and the signal held by the latch circuit 22, that is, a difference between the change amount of the time-to-digital value TD in time for one period of the sampling signal $S_s$ and the set value FCW. The error signal ε is zero when the change amount of the time-to-digital value TD matches the set value FCW, the error signal ε is a positive value when the change amount of the time-to-digital value TD is larger than the set value FCW, and the error signal ε is a negative value when the change amount of the time-to-digital value TD is smaller than the set value FCW.

The frequency adjustment unit 30 adjusts a frequency $f_{VCO}$ of the synthesizer signal $S_{VCO}$ based on the error signal ε, which is the comparison result of the comparison unit 20. In the present embodiment, the frequency adjustment unit 30 outputs a control signal VC for adjusting the frequency $f_{VCO}$ of the synthesizer signal $S_{VCO}$ based on the error signal ε.

In the present embodiment, the frequency adjustment unit 30 adjusts the frequency $f_{VCO}$ of the synthesizer signal $S_{VCO}$ based on the error signal ε such that the difference between the change amount of the time-to-digital value TD and the set value FCW, which is a target value of the change amount, is to be constant. The frequency adjustment unit 30 may adjust the frequency $f_{VCO}$ such that the difference between the change amount of the time-to-digital value TD and the set value FCW is zero, or may adjust the frequency $f_{VCO}$ such that the difference between the change amount of the time-to-digital value TD and the set value FCW is a positive or negative constant value.

Figure 3:
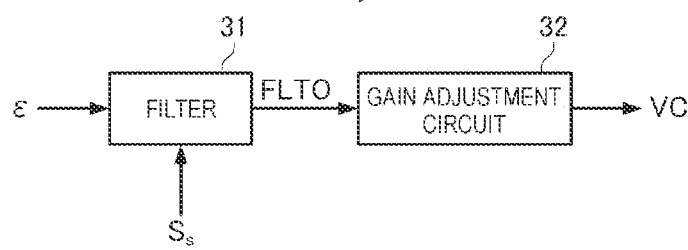
FIG. 3 is a diagram showing a configuration example of a frequency adjustment unit.
Figure 4:
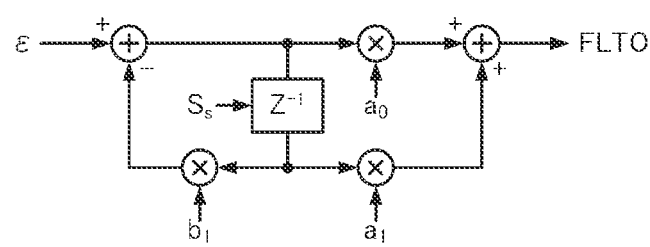
FIG. 4 is a diagram showing a configuration example of a filter.

FIG. 3 is a diagram showing a configuration example of the frequency adjustment unit 30. In the example of FIG. 3, the frequency adjustment unit 30 includes a filter 31 and a gain adjustment circuit 32. The filter 31 is a digital filter that receives the error signal ε, which is the difference between the change amount of the time-to-digital value TD and the set value FCW, which is the target value, and operates in synchronization with the sampling signal $S_s$, and functions as a loop filter that outputs a signal FLTO having reduced noise components. The filter 31 may include a low-pass filter, a lead filter, a lag filter, or a lag lead filter. For example, the filter 31 is implemented as a primary IIR filter as shown in FIG. 4, and a transfer function H(z) thereof is expressed by Equation (1). The primary IIR filter functions as a low-pass filter, a read filter, a lag filter, or a lag lead filter by adjusting coefficients $a_0$, $a_1$, and $b_1$ of the transfer function H(z).

$$H(z) = \frac{a_0 + a_1 z^{-1}}{1 - b_1 z^{-1}} \quad (1)$$

Figure 5:
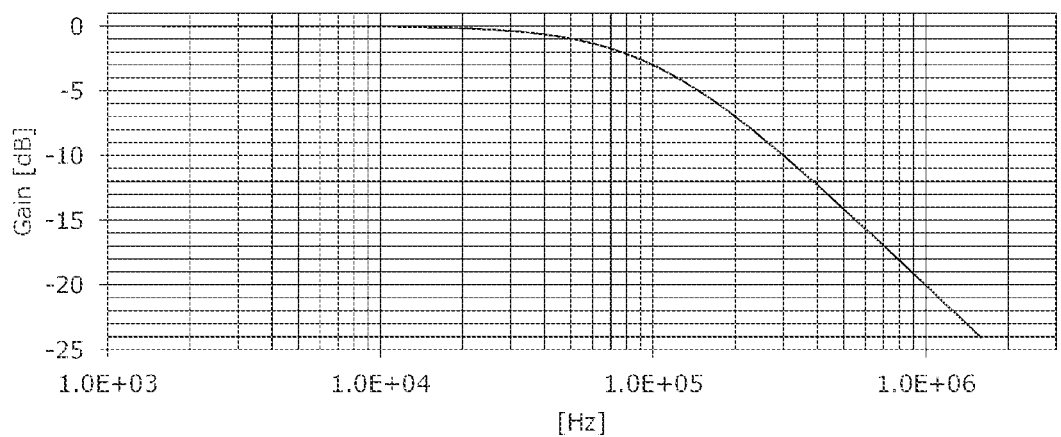
FIG. 5 is a diagram showing gain characteristics of a low-pass filter.
Figure 6:
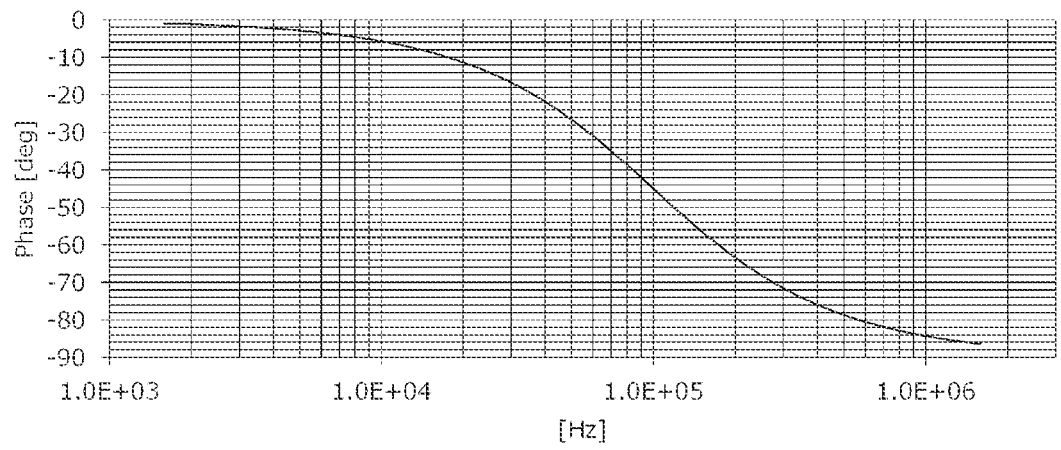
FIG. 6 is a diagram showing phase characteristics of the low-pass filter.

For example, when a frequency $f_{ref}$ of the reference period signal $S_{ref}$ is 260 MHz and the frequency $f_{VCO}$ of the synthesizer signal $S_{VCO}$ is 12 MHz, a frequency $f_s$ of the sampling signal $S_s$ is 12 MHz, and by setting $a_0=a_1\approx0.01292$ and $b_1\approx0.97416$, a low-pass filter having a cut-off frequency $f_c=100$ kHz is implemented. When the frequency $f_{ref}$ of the reference period signal $S_{ref}$ is 260 MHz and the frequency $f_{VCO}$ of the synthesizer signal $S_{VCO}$ is 26.4 MHz, the frequency $f_s$ of the sampling signal $S_s$ is 26.4 MHz, and by setting $a_0=a_1\approx0.0591$ and $b_1\approx0.98817$, the low-pass filter having a cut-off frequency $f_c=100$ kHz is implemented. FIGS. 5 and 6 show gain characteristics and phase characteristics of the low-pass filter having a cutoff frequency $f_c=100$ kHz, respectively.

The gain adjustment circuit 32 outputs the control signal VC for adjusting the frequency $f_{VCO}$ of the synthesizer signal $S_{VCO}$ such that an output signal FLTO of the filter 31 is to be constant.

Returning to the description of FIGS. 1 and 2, the oscillation unit 40 generates the synthesizer signal $S_{VCO}$ based on the control signal VC output from the frequency adjustment unit 30. For example, the oscillation unit 40 may include a voltage-controlled oscillator (not shown) that outputs a signal of a frequency corresponding to a voltage value of the control signal VC. The oscillation unit 40 may output an output signal of the voltage-controlled oscillator as the synthesizer signal $S_{VCO}$, or may further include a frequency divider (not shown) that divides the output signal of the voltage-controlled oscillator and may output an output signal of the frequency divider as the synthesizer signal $S_{VCO}$.

In the frequency synthesizer 1 according to the first embodiment configured as shown in FIG. 1 or 2, the frequency adjustment unit 30 adjusts the frequency $f_{VCO}$ of the synthesizer signal $S_{VCO}$ such that the difference between the change amount of the time-to-digital value TD and the set value FCW is constant, thereby forming a stable FLL in a state where the synthesizer signal $S_{VCO}$ has a desired frequency. FLL is an abbreviation for frequency locked loop.

1-2. Configuration and Operation of Time-to-Digital Converter

Figure 7:
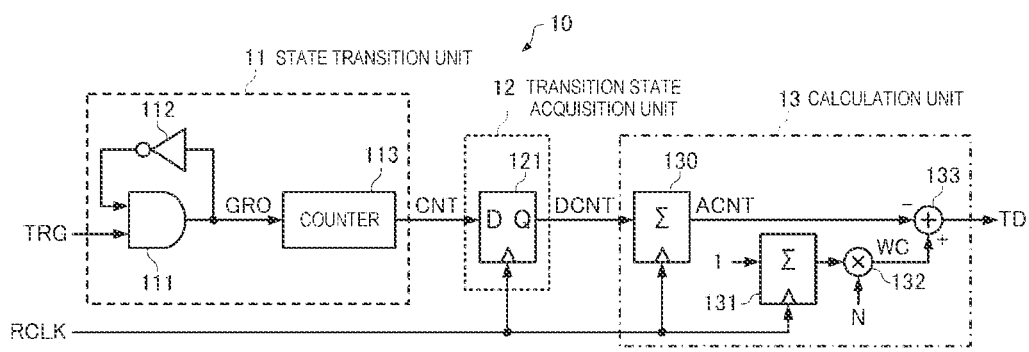
FIG. 7 is a diagram showing a configuration example of a time-to-digital converter according to the first embodiment.

FIG. 7 is a diagram showing a configuration example of the time-to-digital converter 10 according to the first embodiment. As shown in FIG. 7, the time-to-digital converter 10 includes a state transition unit 11, a transition state acquisition unit 12, and a calculation unit 13.

The state transition unit 11 starts a state transition in which an internal state transitions based on the time event of the trigger signal TRG and outputs state information indicating the internal state. As shown in FIG. 7, in the present embodiment, the state transition unit 11 includes a logic product circuit 111, a logic inversion circuit 112, and a counter 113.

The logic product circuit 111 outputs a logic product signal of the trigger signal TRG and an output signal of the logic inversion circuit 112. The logic product signal output from the logic product circuit 111 is at a low level when the trigger signal TRG is at a low level, and is at the same logic level as the output signal of the logic inversion circuit 112 when the trigger signal TRG is at a high level.

The logic inversion circuit 112 outputs a signal obtained by inverting the logic level of the logic product signal output from the logic product circuit 111. Therefore, the logic level of the logic product signal alternates between the low level and the high level when the trigger signal TRG is at the high level. That is, the logic product circuit 111 and the logic inversion circuit 112 constitute a ring oscillator circuit, and the state transition unit 11 outputs the logic product signal output from the logic product circuit 111 as an oscillation signal GRO. A change in a logic level of the oscillation signal GRO can be considered to correspond to a change in the internal state of the state transition unit 11. That is, the state transition unit 11 starts the state transition in which the internal state transitions based on the rising edge of the trigger signal TRG, and stops the state transition based on the falling edge of the trigger signal TRG.

The counter 113 counts at least one of a rising edge and a falling edge of the oscillation signal GRO output from the state transition unit 11, and outputs a count value CNT. The count value CNT is the state information indicating the internal state of the state transition unit 11, and corresponds to the number of transition times of the internal state after the state transition unit 11 starts the state transition in the present embodiment. The counter 113 may stop the count operation when the count value CNT reaches a predetermined upper limit value, and may output the upper limit value as the count value CNT. The count value CNT is initialized to zero until a next time event of the trigger signal TRG.

The transition state acquisition unit 12 acquires and holds the count value CNT, which is the state information from the state transition unit 11, in synchronization with the operating clock signal RCLK. As shown in FIG. 7, in the present embodiment, the transition state acquisition unit 12 includes a latch circuit 121 including a plurality of D flip-flops. The latch circuit 121 acquires the count value CNT, which is the state information, in synchronization with the rising edge of the operating clock signal RCLK, and holds the count value CNT as a count value DCNT, which is the state information. The count value DCNT corresponds to the number of transition times of the internal state of the state transition unit 11 during a period from when the state transition unit 11 starts the state transition until each rising edge of the operating clock signal RCLK occurs.

The calculation unit 13 calculates the time-to-digital value TD corresponding to the number of transition times of the internal state of the state transition unit 11 based on the count value DCNT, which is the state information, acquired and held by the transition state acquisition unit 12. The calculation unit 13 may calculate an integrated value obtained by integrating the number of transition times of the internal state of the state transition unit 11 based on the count value DCNT and may calculate the time-to-digital value TD based on the integrated value. For example, the calculation unit 13 may calculate the time-to-digital value TD by performing a predetermined calculation on a value weighted with time and the integrated value obtained by integrating the number of transition times of the internal state of the state transition unit 11. The predetermined calculation may be, for example, subtraction.

As shown in FIG. 7, in the present embodiment, the calculation unit 13 includes an integrator 130, an integrator 131, a multiplier 132, and a subtractor 133.

The integrator 130 integrates the count value DCNT, which is the state information, in synchronization with the rising edge of the operating clock signal RCLK, and outputs an integrated value ACNT. The integrated value ACNT is an integrated value obtained by integrating the number of transition times of the internal state of the state transition unit 11 during a period from when the state transition unit 11 starts the state transition until each rising edge of the operating clock signal RCLK occurs.

The integrator 131 integrates 1 in synchronization with the rising edge of the operating clock signal RCLK. An integrated value output from the integrator 131 indicates a total number of rising edges of the operating clock signal RCLK.

The multiplier 132 multiplies the integrated value output from the integrator 131 by an integer N. The integer N is set to, for example, the upper limit value of the count value CNT. A multiplied value by the multiplier 132 is a value N times the total number of rising edges of the operating clock signal RCLK, and is a value weighted with time. That is, the multiplier 132 outputs a weight coefficient value WC.

The subtractor 133 outputs a value obtained by subtracting the integrated value ACNT from the weight coefficient value WC as the time-to-digital value TD. The time-to-digital value TD is a value corresponding to the phase difference between the time event of the operating clock signal RCLK and the time event of the trigger signal TRG.

Both the latch circuit 121 and the integrator 131 may operate in synchronization with the falling edge of the operating clock signal RCLK or may operate in synchronization with both the rising edge and the falling edge of the operating clock signal RCLK.

Figure 8:
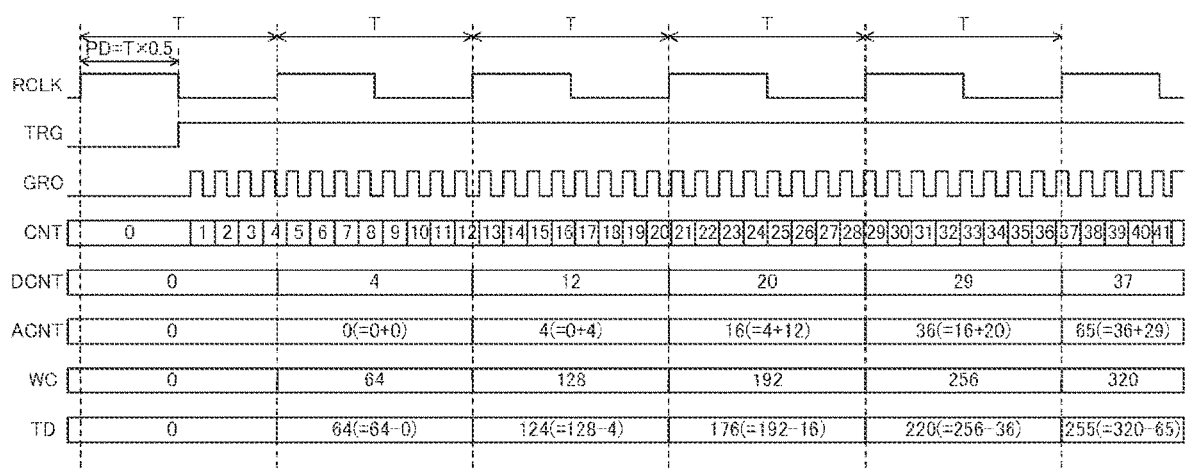
FIG. 8 is a timing chart showing an example of an operation timing of the time-to-digital converter according to the first embodiment.
Figure 9:
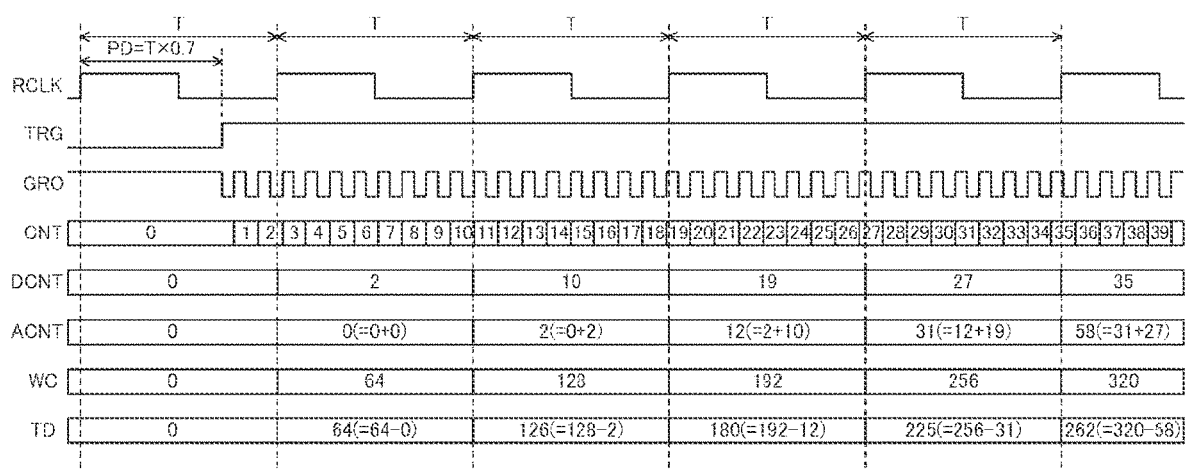
FIG. 9 is a timing chart showing an example of an operation timing of the time-to-digital converter according to the first embodiment.

FIGS. 8 and 9 are timing charts showing examples of an operation timing of the time-to-digital converter 10. In FIGS. 8 and 9, the integer N of FIG. 7 is 64, and the time event of the operating clock signal RCLK is the rising edge. In addition, with respect to time T for one period of the operating clock signal RCLK, the phase difference PD between the time event of the operating clock signal RCLK and the time event of the trigger signal TRG is T×0.5 in the example of FIG. 8, and is T×0.7 in the example of FIG. 9.

In the examples of FIGS. 8 and 9, when the time event of the trigger signal TRG occurs, the state transition unit 11 starts the state transition, the logic level of the oscillation signal GRO alternates between the low level and the high level, and the count value CNT increases by 1 from 0 in synchronization with the rising edge of the oscillation signal GRO.

Then, in the example of FIG. 8, each time the time event of the operating clock signal RCLK occurs, the count value DCNT increases like 0, 4, 12, 20, 29, and 37, and accordingly, the integrated value ACNT increases like 0, 4, 16, 36, and 65. In addition, each time the time event of the operating clock signal RCLK occurs, the weight coefficient value WC increases like 0, 64, 128, 192, 256, and 320. As a result, the time-to-digital value TD increases like 0, 64, 124, 176, 220, and 255.

On the other hand, in the example of FIG. 9, each time the time event of the operating clock signal RCLK occurs, the count value DCNT increases like 0, 2, 10, 19, 27, and 35, and accordingly, the integrated value ACNT increases like 0, 2, 12, 31, and 58. In addition, each time the time event of the operating clock signal RCLK occurs, the weight coefficient value WC increases like 0, 64, 128, 192, 256, and 320. As a result, the time-to-digital value TD increases like 0, 64, 126, 180, 225, and 262.

Comparing FIG. 8 and FIG. 9, the time-to-digital value TD in the example of FIG. 9 in which the phase difference PD is larger is larger than the time-to-digital value TD in the example of FIG. 8 in which the phase difference PD is smaller. That is, the time-to-digital converter 10 outputs a time-to-digital value TD having a larger value as the phase difference PD increases. Also, the time-to-digital converter 10 may output a time-to-digital value TD having a smaller value as the phase difference PD increases.

Figures 10, 11:
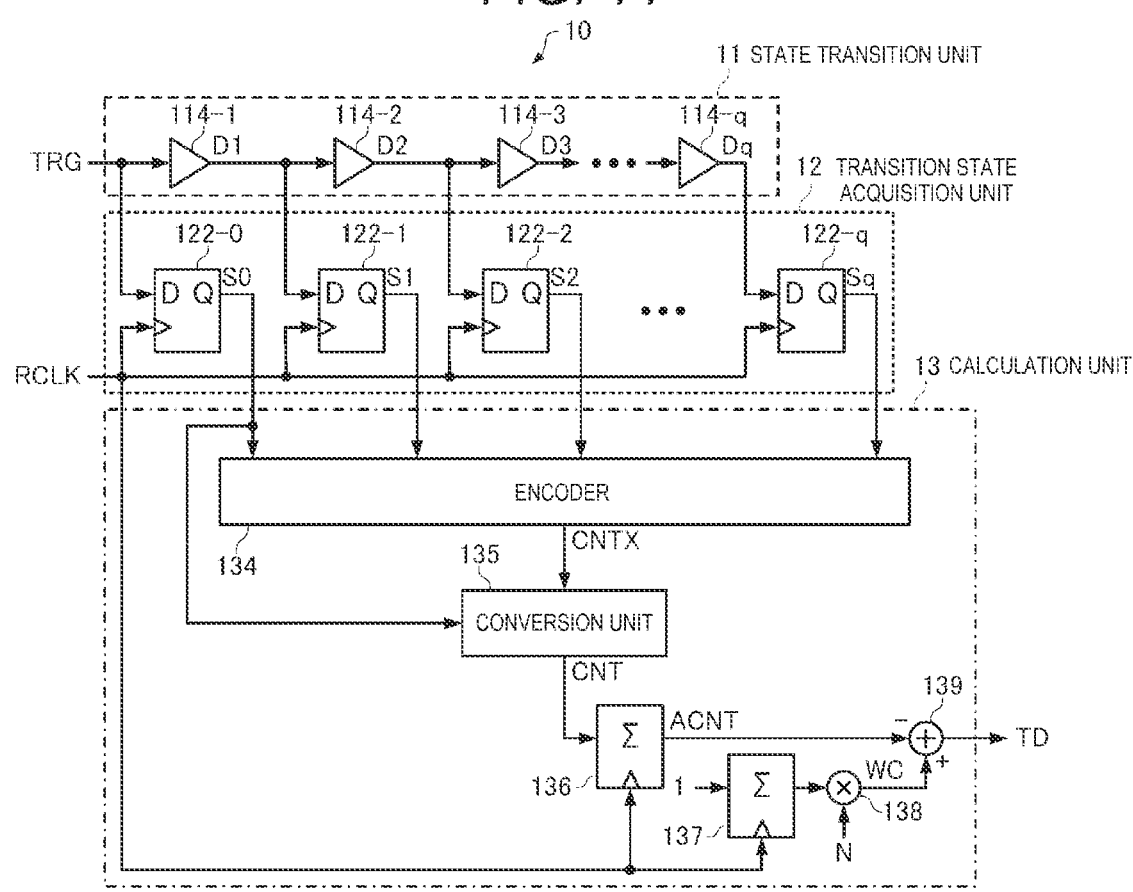
FIG. 10 is a diagram showing a relationship among a phase difference PD, a count value DCNT, and a time-to-digital value TD.
FIG. 11 is a diagram showing a configuration example of a time-to-digital converter according to a second embodiment.

FIG. 10 is a diagram showing a relationship among the phase difference PD, the count value DCNT, and the time-to-digital value TD. In FIG. 10, the upper limit value of the count value CNT is 64. As shown in FIG. 10, each time the time event of the operating clock signal RCLK occurs, the count value DCNT is integrated to increase the time-to-digital value TD. When the time event of the operating clock signal RCLK is set as a 0th rising edge and when the phase difference PD is T×0.5 and T×0.7, the count value DCNT reaches 64, which is the upper limit value of the count value CNT, at a 9th rising edge of the operating clock signal RCLK. In addition, when the phase difference PD is T×1.5 and T×1.7, the count value DCNT reaches 64, which is the upper limit value of the count value CNT, at a 10th rising edge of the operating clock signal RCLK. Further, after the 10th rising edge of the operating clock signal RCLK, a difference between a time-to-digital value TD when the phase difference PD is T×1.5 and a time-to-digital value TD when the phase difference PD is T×0.5 is always 64, and a difference between a time-to-digital value TD when the phase difference PD is T×1.7 and a time-to-digital value TD when the phase difference PD is T×0.7 is always 64. That is, when the phase difference PD increases by the time T of one period of the operating clock signal RCLK, the time-to-digital value TD increases by 64.

As described above, since the time-to-digital value TD is the value corresponding to the phase difference between the time event of the operating clock signal RCLK and the time event of the trigger signal TRG, the time-to-digital converter 10 functions as a phase detection unit that detects a phase difference between the operating clock signal RCLK and the trigger signal TRG. As described above, the operating clock signal RCLK and the trigger signal TRG are either the reference period signal $S_{ref}$ or the synthesizer signal $S_{VCO}$, respectively. Therefore, by adjusting the frequency $f_{VCO}$ of the synthesizer signal $S_{VCO}$ by the frequency adjustment unit 30 such that the difference between the change amount of the time-to-digital value TD and the set value FCW is to be constant, the stable FLL is formed in a state where the synthesizer signal $S_{VCO}$ has a desired frequency while a phase difference between the reference period signal $S_{ref}$ and the synthesizer signal $S_{VCO}$ changes according to the set value FCW. When the integrator 131 is reset before the state transition unit 11 starts the state transition, a stable PLL is formed in a state where the phase difference between the reference period signal $S_{ref}$ and the synthesizer signal $S_{VCO}$ is constant and the synthesizer signal $S_{VCO}$ has a desired frequency. PLL is an abbreviation for phase locked loop.

1-3. Function and Effect

As described above, in the frequency synthesizer 1 according to the first embodiment, the time-to-digital converter 10 outputs the time-to-digital value TD corresponding to the time event of the trigger signal TRG with respect to the operating clock signal RCLK, the operating clock signal RCLK is the signal having a shorter period and the trigger signal TRG is the signal having a longer period among the reference period signal $S_{ref}$ and the synthesizer signal $S_{VCO}$. Then, the comparison unit 20 compares the change amount of the time-to-digital value TD with the target value, which is the set value FCW, and the frequency adjustment unit 30 adjusts the frequency of the synthesizer signal $S_{VCO}$ such that the difference between the change amount of the time-to-digital value TD and the target value is constant. Therefore, the time-to-digital converter 10 functions as a phase detection unit that detects a phase difference between the reference period signal $S_{ref}$ and the synthesizer signal $S_{VCO}$, and since the FLL is formed by the time-to-digital converter 10, the comparison unit 20, the frequency adjustment unit 30, and the oscillation unit 40, a synthesizer signal $S_{VCO}$ having a desired frequency can be output. Then, the time-to-digital converter 10 has a relatively simple configuration including the state transition unit 11, the transition state acquisition unit 12, and the calculation unit 13, and since a resolution of phase detection is improved by increasing the number of bits of the time-to-digital value TD, frequency accuracy of the synthesizer signal $S_{VCO}$ can be improved. Therefore, according to the frequency synthesizer 1 of the first embodiment, a synthesizer signal $S_{VCO}$ with high frequency accuracy can be output while limiting an increase in circuit scale as compared with a frequency synthesizer using a circuit in which a large number of frequency delta-sigma modulation units are provided in parallel instead of the time-to-digital converter 10.

According to the frequency synthesizer 1 of the first embodiment, since the noise components are reduced by the filter 31 of the frequency adjustment unit 30, SNR of the synthesizer signal $S_{VCO}$ is improved. SNR is an abbreviation for signal to noise ratio.

According to the frequency synthesizer 1 of the first embodiment, since the calculation unit 13 of the time-to-digital converter 10 calculates the time-to-digital value TD based on the integrated value ACNT obtained by integrating the count value DCNT acquired by the transition state acquisition unit 12, the resolution of the phase detection is improved by increasing the number of integrations, and the frequency accuracy of the synthesizer signal $S_{VCO}$ can be improved.

2. Second Embodiment

Hereinafter, for the frequency synthesizer 1 according to a second embodiment, the same components as those in the first embodiment are denoted by the same reference numerals, the description overlapping with that in the first embodiment is omitted or simplified, and contents different from those in the first embodiment will be mainly described.

Since a configuration of the frequency synthesizer 1 according to the second embodiment is the same as that of FIG. 1, illustration and description thereof will be omitted. In the frequency synthesizer 1 according to the second embodiment, a configuration of the time-to-digital converter 10 is different from that in the first embodiment.

FIG. 11 is a diagram showing a configuration example of the time-to-digital converter 10 according to the second embodiment. As shown in FIG. 11, the time-to-digital converter 10 includes the state transition unit 11, the transition state acquisition unit 12, and the calculation unit 13.

The state transition unit 11 starts a state transition in which an internal state transitions based on a time event of the trigger signal TRG and outputs state information indicating the internal state. As shown in FIG. 11, in the present embodiment, the state transition unit 11 includes the logic product circuit 111, the logic inversion circuit 112, and the counter 113. The state transition unit 11 includes a multi-stage delay circuit that includes a plurality of delay elements 114-1 to 114-q. q is an integer of 2 or more.

The delay elements 114-1 to 114-q are coupled in a chain shape, and constitute the multi-stage delay circuit including one input terminal and q output terminals. Each of the delay elements 114-1 to 114-q is a buffer element or a logic inversion element. Since it is desirable that delay times of the delay elements 114-1 to 114-q are substantially equal, the same type of element is used as the delay elements 114-1 to 114-q. In the following description, it is assumed that all of the delay elements 114-1 to 114-q are buffer elements.

An input terminal of the delay element 114-1 serves as the input terminal of the multi-stage delay circuit. In addition, output terminals of the delay elements 114-1 to 114-q serve as the q output terminals of the multi-stage delay circuit. From the q output terminals of the multi-stage delay circuit, signals D1 to Dq are output in order from the input terminal side of the multi-stage delay circuit.

The trigger signal TRG is input to the input terminal of the delay element 114-1. The trigger signal TRG changes from a low level to a high level, and a high level signal propagates through the delay element 114-1, whereby the signal D1 changes from a low level to a high level. Then, with respect to each integer i of 2 or more and q or less, a high level signal Di-1 propagates through the delay element 114-i, whereby the signal Di changes from a low level to a high level. That is, when the trigger signal TRG changes from the low level to the high level, the high level signal sequentially propagates through the delay elements 114-1 to 114-q, and the signals D1 to Dq sequentially change from the low level to the high level.

Similarly, the trigger signal TRG changes from a high level to a low level, and a low level signal propagates through the delay element 114-1, whereby the signal D1 changes from a high level to a low level. Then, with respect to each integer i of 2 or more and q or less, a low level signal Di-1 propagates through the delay element 114-i, whereby the signal Di changes from a high level to a low level. That is, when the trigger signal TRG changes from the high level to the low level, the low level signal sequentially propagates through the delay elements 114-1 to 114-q, and the signals D1 to Dq sequentially change from the high level to the low level.

As described above, a combination of logic levels of the trigger signal TRG and the q signals D1 to Dq indicates a state of the multi-stage delay circuit, and the multi-stage delay circuit starts the state transition based on the time event of the trigger signal TRG. The state of the multi-stage delay circuit corresponds to the internal state of the state transition unit 11, and the trigger signal TRG and the q signals D1 to Dq correspond to the state information indicating the internal state of the state transition unit 11.

The transition state acquisition unit 12 acquires and holds the trigger signal TRG and the q signals D1 to Dq, which are the state information, from the state transition unit 11 in synchronization with the operating clock signal RCLK. As shown in FIG. 11, in the present embodiment, the transition state acquisition unit 12 includes a plurality of D flip-flops 122-0 to 122-q. The D flip-flop 122-0 acquires the trigger signal TRG in synchronization with a rising edge of the operating clock signal RCLK and holds the trigger signal TRG as a signal S0. In addition, for each integer i of 1 or more and q or less, the D flip-flop 122-$i$ acquires the signal Di in synchronization with the rising edge of the operating clock signal RCLK and holds the signal Di as a signal Si.

The calculation unit 13 calculates the time-to-digital value TD corresponding to the number of transition times of the internal state of the state transition unit 11 based on the count value DCNT, which is the state information acquired and held by the transition state acquisition unit 12. The calculation unit 13 may calculate the time-to-digital value TD based on an integrated value obtained by integrating the number of transition times of the internal state of the state transition unit 11 in synchronization with the operating clock signal RCLK. A predetermined calculation may be, for example, subtraction.

As shown in FIG. 11, in the present embodiment, the calculation unit 13 includes an encoder 134, a conversion unit 135, an integrator 136, an integrator 137, a multiplier 138, and a subtractor 139.

The encoder 134 counts the number of high level signals among q signals S0 to Sq held by the transition state acquisition unit 12, and outputs a count value CNTX. That is, if the number of high level signals among the signals S0 to Sq is j, the count value CNTX is j.

The conversion unit 135 converts the count value CNTX output from the encoder 134 into the count value CNT corresponding to the number of state transitions after the state transition unit 11 starts the state transition based on the time event of the trigger signal TRG, and outputs the count value CNT. When the time event of the trigger signal TRG is a rising edge, the count value CNTX corresponds to the number of state transitions of the state transition unit 11. Therefore, when the trigger signal TRG is at a high level, the conversion unit 135 outputs the same count value CNT as the count value CNTX. On the other hand, when the time event of the trigger signal TRG is a falling edge, a value obtained by subtracting the count value CNTX from q+1 corresponds to the number of state transitions of the state transition unit 11. Therefore, when the trigger signal TRG is at a low level, the conversion unit 135 outputs the count value CNT obtained by subtracting the count value CNTX from q+1.

The integrator 136 integrates the count value CNT output from the conversion unit 135 in synchronization with the rising edge of the operating clock signal RCLK, and outputs the integrated value ACNT.

The integrator 137 integrates 1 in synchronization with the rising edge of the operating clock signal RCLK. An integrated value output from the integrator 137 indicates a total number of rising edges of the operating clock signal RCLK.

The multiplier 138 multiplies the integrated value output from the integrator 137 by an integer N. The integer N is set to, for example, an upper limit value of the count value CNT. A multiplied value by the multiplier 138 is a value N times the total number of rising edges of the operating clock signal RCLK, and is a value weighted with time. That is, the multiplier 138 outputs the weight coefficient value WC.

The subtractor 139 outputs a value obtained by subtracting the integrated value ACNT from the weight coefficient value WC as the time-to-digital value TD. The time-to-digital value TD is a value corresponding to the phase difference between a time event of the operating clock signal RCLK and the time event of the trigger signal TRG.

FIG. 12 is a timing chart showing an example of an operation timing of the time-to-digital converter 10 according to the second embodiment. In FIG. 12, the upper limit value of the count value CNT and the integer N in FIG. 11 are both 64, and the integer q is 63. The time event of the operating clock signal RCLK is a rising edge, and the time event of the trigger signal TRG includes a rising edge and a falling edge.

In the example of FIG. 12, the rising edge of the trigger signal TRG occurs between a 1st rising edge and a 2nd rising edge of the operating clock signal RCLK, and the state transition unit 11 starts the state transition. Then, when the count value CNTX increases like 4, 12, 20, 29, 37, 45, 53, and 62 in synchronization with the rising edge of the operating clock signal RCLK and reaches the upper limit value 64, the state transition unit 11 stops the state transition. The count value CNT also increases like 4, 12, 20, 29, 37, 45, 53, and 62 and reaches the upper limit value 64, and accordingly, the integrated value ACNT increases like 0, 4, 16, 36, 65, 102, 147, 200, 262, 326, and 390. In addition, the weight coefficient value WC increases like 64, 128, 192, 256, 320, 384, 448, 512, 576, 640, and 704 in synchronization with the rising edge of the operating clock signal RCLK. As a result, the time-to-digital value TD increases like 64, 124, 176, 220, 255, 282, 301, 312, and 314, and maintains 314.

In the example of FIG. 12, the falling edge of the trigger signal TRG occurs between a 12th rising edge and a 13th rising edge of the operating clock signal RCLK, and the state transition unit 11 starts the state transition. When the count value CNTX decreases like 62, 54, 45, 37, 29, 21, 14, and 4 in synchronization with the rising edge of the operating clock signal RCLK and reaches a lower limit value 0, the state transition unit 11 stops the state transition. The count value CNT increases like 2, 10, 19, 27, 35, 43, 51, and 60 and reaches the upper limit value 64, and accordingly, the integrated value ACNT increases like 0, 2, 12, 31, 58, 93, 136, 187, 247, 311, and 375. In addition, the weight coefficient value WC increases like 768, 832, 896, 960, 1024, 1088, 1152, 1216, 1280, 1344, and 1408 in synchronization with the rising edge of the operating clock signal RCLK. As a result, the time-to-digital value TD increases like 768, 830, 884, 929, 966, 995, 1016, 1029, and 1033, and maintains 1033.

In the example of FIG. 12, the rising edge of the trigger signal TRG occurs between a 23rd rising edge and a 24th rising edge of the operating clock signal RCLK, and the state transition unit 11 starts the state transition. Then, the count value CNTX increases like 1, 9, 17, 26, and 34 in synchronization with the rising edge of the operating clock signal RCLK. The count value CNT also increases like 1, 9, 17, 26, and 34, and accordingly, the integrated value ACNT increases like 0, 1, 10, 27, and 53. In addition, the weight coefficient value WC increases like 1472, 1536, 1600, 1664, and 1728 in synchronization with the rising edge of the operating clock signal RCLK. As a result, the time-to-digital value TD increases like 1472, 1535, 1590, 1637, and 1675.

According to the frequency synthesizer 1 of the second embodiment described above, the same effects as those in the first embodiment can be obtained.

In the frequency synthesizer 1 according to the second embodiment, the state transition unit 11 includes the multistage delay circuit including the plurality of delay elements 114-1 to 114-$q$ through which the trigger signal TRG propagates. Therefore, according to the frequency synthesizer 1 of the second embodiment, since the number of internal states of the state transition unit 11 can be increased according to the number of delay elements 114-1 to 114-$q$, a resolution of phase detection by the time-to-digital converter 10 can be improved, and frequency accuracy of the synthesizer signal $S_{VCO}$ can be improved.

In the multi-stage delay circuit of the state transition unit 11, a loop may be formed such that the signal Dq output from the delay element 114-$q$ is input to the delay element 114-1 in a period in which the logic level of the trigger signal TRG is constant. In this case, the calculation unit 13 can count the number of times the trigger signal TRG propagates through the multi-stage delay circuit and calculate the time-to-digital value TD based on a count value and the signals S0 to Sq. In this way, the number of delay elements 114-1 to 114-$q$ and D flip-flops 122-0 to 122-$q$ can be reduced.

3. Third Embodiment

Hereinafter, for the frequency synthesizer 1 according to a third embodiment, the same components as those in the first and second embodiments are denoted by the same reference numerals, the description overlapping with those in the first and second embodiments is omitted or simplified, and contents different from those in the first and second embodiments will be mainly described.

In the frequency synthesizer 1 according to the third embodiment, similarly to the frequency synthesizer 1 according to the second embodiment, the time-to-digital converter 10 includes the state transition unit 11 that includes a multi-stage delay circuit, the transition state acquisition unit 12 that acquires an input signal and a plurality of output signals of the multi-stage delay circuit, and the calculation unit 13.

The time-to-digital converter 10 according to the second embodiment operates normally when a time interval between two consecutive time events of the trigger signal TRG is longer than time from start to stop of state transition by the state transition unit 11. That is, when the time interval between the two consecutive time events of the trigger signal TRG is longer than time for the trigger signal TRG to propagate through the multi-stage delay circuit provided in the transition state acquisition unit 12, the time-to-digital converter 10 according to the second embodiment can calculate a correct time-to-digital value TD by the multi-stage delay circuit performing the state transition based on one time event of the trigger signal TRG. On the other hand, the time-to-digital converter 10 according to the third embodiment operates normally when the time interval between the two consecutive time events of the trigger signal TRG is longer than ½ of the time from start to stop of the state transition by the state transition unit 11. That is, when the time interval between the two consecutive time events of the trigger signal TRG is longer than ½ of the time for the trigger signal TRG to propagate through the multi-stage delay circuit provided in the transition state acquisition unit 12 and the multi-stage delay circuit performs the state transition based on two or less time events of the trigger signal TRG, the time-to-digital converter 10 according to the third embodiment can calculate a correct time-to-digital value TD.

Figure 13:
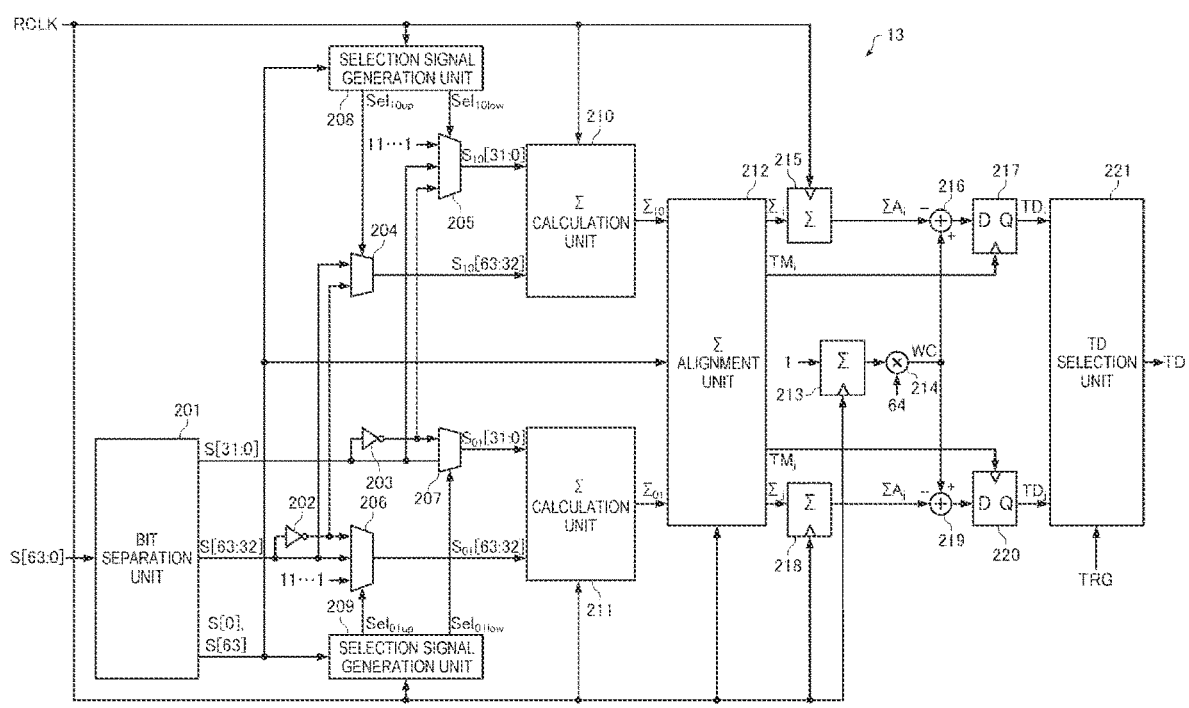
FIG. 13 is a diagram showing a configuration example of a calculation unit according to a third embodiment.

In the time-to-digital converter 10 according to the third embodiment, configurations of the state transition unit 11 and the transition state acquisition unit 12 are the same as those in the second embodiment, and a configuration of the calculation unit 13 is different from that in the second embodiment. FIG. 13 is a diagram showing a configuration example of the calculation unit 13 according to the third embodiment. FIG. 13 shows a configuration example of the calculation unit 13 when 64 signals S0 to S63 are output from the transition state acquisition unit 12, that is, when q=63, but q may be a number other than 63. In FIG. 13, a 64-bit signal S[63: 0] corresponds to the 64 signals S63 to S0. In addition, an upper 32-bit signal S[63: 32] of the signal S[63: 0] corresponds to the 32 signals S63 to S32, and a lower 32-bit signal S[31: 0] of the signal S[63: 0] corresponds to the 32 signals S31 to S0. A most significant bit signal S[63] of the signal S[63: 0] corresponds to the signal S63, and a least significant bit signal S[0] of the signal S[63: 0] corresponds to the signal S0.

As shown in FIG. 13, the calculation unit 13 according to the third embodiment includes a bit separation unit 201, logic inversion circuits 202 and 203, selectors 204, 205, 206, and 207, selection signal generation units 208 and 209, Σ calculation units 210 and 211, a Σ alignment unit 212, an integrator 213, a multiplier 214, an integrator 215, a subtractor 216, a latch circuit 217, an integrator 218, a subtractor 219, a latch circuit 220, and a TD selection unit 221.

The bit separation unit 201 separates the signal S[63: 0] into the lower 32-bit signal S[31: 0] and the upper 32 bit-signal S[63: 32] and outputs the lower 32-bit signal S[31: 0] and the upper 32 bit-signal S[63: 32]. In addition, the bit separation unit 201 outputs the least significant bit signal S[0] and the most significant bit signal S[63] of the signal S[63: 0].

The logic inversion circuit 202 outputs a 32-bit logic inversion signal obtained by inverting a logic level of each of the 32-bit signals S[63: 32] output from the bit separation unit 201.

The logic inversion circuit 203 outputs a 32-bit logic inversion signal obtained by inverting a logic level of each of the 32-bit signals S[31: 0] output from the bit separation unit 201.

The selector 204 selects any one of the 32-bit signal S[63: 32] and the 32-bit logic inversion signal output from the logic inversion circuit 202 according to an upper selection signal $Sel_{10up}$ output from the selection signal generation unit 208, and outputs the selected signal as an upper 32-bit signal $S_{10}[63: 32]$ of a 64-bit signal $S_{10}[63: 0]$.

The selector 205 selects any one of a 32-bit high level signal in which a logic value of each bit is 1, the 32-bit signal S[31: 0], and the 32-bit logic inversion signal output from the logic inversion circuit 203 according to a lower selection signal $Sel_{10low}$ output from the selection signal generation unit 208, and outputs the selected signal as a lower 32-bit signal $S_{10}[31: 0]$ of the 64-bit signal $S_{10}[63: 0]$.

The selector 206 selects any one of the 32-bit logic inversion signal output from the logic inversion circuit 202, the 32-bit signal S[63: 32], and the 32-bit high level signal in which the logic value of each bit is 1 according to an upper selection signal $Sel_{01up}$ output from the selection signal generation unit 209, and outputs the selected signal as an upper 32-bit signal $S_{01}[63: 32]$ of a 64-bit signal $S_{01}[63: 0]$.

The selector 207 selects any one of the 32-bit logic inversion signal output from the logic inversion circuit 203 and the 32-bit signal S[31: 0] according to a lower selection signal $Sel_{01low}$ output from the selection signal generation unit 209, and outputs the selected signal as a lower 32-bit signal $S_{01}[31: 0]$ of the 64-bit signal $S_{01}[63: 0]$.

The selection signal generation unit 208 generates and outputs the upper selection signal $Sel_{10up}$ and the lower selection signal $Sel_{10low}$ based on the signal S[0] and the signal S[63] output from the bit separation unit 201. Specifically, when a logic value of the signal S[0] and a logic value of the signal S[63] are different, the selection signal generation unit 208 outputs the upper selection signal $Sel_{10up}$ that causes the selector 204 to select the 32-bit signal $S[63:32]$ and outputs the lower selection signal $Sel_{10low}$ that causes the selector 205 to select the 32-bit signal $S[31:0]$. In addition, when both the logic value of the signal $S[0]$ and the logic value of the signal $S[63]$ are 0, the selection signal generation unit 208 outputs the upper selection signal $Sel_{10up}$ that causes the selector 204 to select the 32-bit signal $S[63:32]$ and outputs the lower selection signal $Sel_{10low}$ that causes the selector 205 to select the 32-bit high level signal. In addition, when both the logic value of the signal $S[0]$ and the logic value of the signal $S[63]$ are 1, the selection signal generation unit 208 outputs the upper selection signal $Sel_{10up}$ that causes the selector 204 to select a logic inversion signal of the 32-bit signal $S[63:32]$ and outputs the lower selection signal $Sel_{10low}$ that causes the selector 205 to select the 32-bit high level signal.

The selection signal generation unit 209 generates and outputs the upper selection signal $Sel_{01up}$ and the lower selection signal $Sel_{01low}$ based on the signal $S[0]$ and the signal $S[63]$ output from the bit separation unit 201. Specifically, when the logic value of the signal $S[0]$ and the logic value of the signal $S[63]$ are different, the selection signal generation unit 209 outputs the upper selection signal $Sel_{01up}$ that causes the selector 206 to select the 32-bit signal $S[63:32]$ and outputs the lower selection signal $Sel_{01low}$ that causes the selector 207 to select the 32-bit signal $S[31:0]$. In addition, when both the logic value of the signal $S[0]$ and the logic value of the signal $S[63]$ are 0, the selection signal generation unit 209 outputs the upper selection signal $Sel_{01up}$ that causes the selector 206 to select the 32-bit high level signal and outputs the lower selection signal $Sel_{01low}$ that causes the selector 207 to select the 32-bit signal $S[31:0]$. In addition, when both the logic value of the signal $S[0]$ and the logic value of the signal $S[63]$ are 1, the selection signal generation unit 209 outputs the upper selection signal $Sel_{01up}$ that causes the selector 206 to select the 32-bit high level signal and outputs the lower selection signal $Sel_{01low}$ that causes the selector 207 to select a logic inversion signal of the 32-bit signal $S[31:0]$.

The $\Sigma$ calculation unit 210 receives the 64-bit signal $S_{10}[63:0]$ including the 32-bit signal $S_{10}[63:32]$ output from the selector 204 and the 32-bit signal $S_{10}[31:0]$ output from the selector 205, and counts the number of bits in which the logic value is 1 in the signal $S_{10}[63:0]$ to calculate a count value $\Sigma_{10}'$. Then, the $\Sigma$ calculation unit 210 outputs the count value $\Sigma_{10}'$ as a count value $\Sigma_{10}$ when a logic value of a least significant bit signal $S_{10}[0]$ is 1, and outputs a value obtained by subtracting the count value $\Sigma_{10}'$ from 64 as the count value $\Sigma_{10}$ when the logic value of the least significant bit signal $S_{10}[0]$ is 0.

The $\Sigma$ calculation unit 211 receives the 64-bit signal $S_{01}[63:0]$ including the 32-bit signal $S_{01}[63:32]$ output from the selector 206 and the 32-bit signal $S_{01}[31:0]$ output from the selector 207, and counts the number of bits in which the logic value is 1 in the signal $S_{01}[63:0]$ to calculate a count value $\Sigma_{01}'$. Then, the $\Sigma$ calculation unit 211 outputs the count value $\Sigma_{01}'$ as a count value $\Sigma_{01}$ when a logic value of a least significant bit signal $S_{01}[0]$ is 1, and outputs a value obtained by subtracting the count value $\Sigma_{01}'$ from 64 as the count value $\Sigma_{01}$ when the logic value of the least significant bit signal $S_{01}[0]$ is 0.

The $\Sigma$ alignment unit 212 outputs the count value $\Sigma_{10}$ as a count value $\Sigma_i$ when both the logic value of the signal $S[0]$ and the logic value of the signal $S[63]$ are 0, the count value $\Sigma_{01}$ as the count value $\Sigma_i$ when the logic value of the signal $S[0]$ is 1, and outputs 64 as the count value $\Sigma_i$ when the logic value of the signal $S[0]$ is 0 and the logic value of the signal $S[63]$ is 1. The $\Sigma$ alignment unit 212 outputs the count value $\Sigma_{10}$ as a count value $\Sigma_j$ when both the logic value of the signal $S[0]$ and the logic value of the signal $S[63]$ are 1, outputs the count value $\Sigma_{01}$ as the count value $\Sigma_j$ when the logic value of the signal $S[0]$ is 0, and outputs 64 as the count value $\Sigma_j$ when the logic value of the signal $S[0]$ is 1 and the logic value of the signal $S[63]$ is 0. The count value $\Sigma_i$ is the number of transition times of an internal state of the state transition unit 11 from when the state transition unit 11 starts the state transition by a rising edge of the trigger signal TRG to when the rising edge of the operating clock signal RCLK occurs. In addition, the count value $\Sigma_j$ is the number of transition times of the internal state of the state transition unit 11 from when the state transition unit 11 starts the state transition by a falling edge of the trigger signal TRG to when the rising edge of the operating clock signal RCLK occurs.

The integrator 213 integrates 1 in synchronization with the rising edge of the operating clock signal RCLK. An integrated value output from the integrator 213 indicates a total number of rising edges of the operating clock signal RCLK.

The multiplier 214 multiplies the integrated value output from the integrator 213 by 64. 64 is an upper limit value of the count value $\Sigma_i$. A multiplied value by the multiplier 214 is a value N times the total number of rising edges of the operating clock signal RCLK, and is a value weighted with time. That is, the multiplier 214 outputs the weight coefficient value WC.

The integrator 215 integrates the count value $\Sigma_i$ in synchronization with the rising edge of the operating clock signal RCLK and outputs an integrated value $\Sigma A_i$. The integrated value $\Sigma A_i$ is an integrated value obtained by integrating the number of transition times of the internal state of the state transition unit 11 from when the state transition unit 11 starts the state transition by the rising edge of the trigger signal TRG to when each rising edge of the operating clock signal RCLK occurs. The integrator 215 integrates the count value $\Sigma_i$ a predetermined number of times, and initializes the integrated value $\Sigma A_i$ to 0 each time the logic value of the signal $S[0]$ changes from 0 to 1.

The subtractor 216 outputs a value obtained by subtracting the integrated value $\Sigma A_i$ from the weight coefficient value WC.

The latch circuit 217 includes a plurality of D flip-flops, acquires the value output from the subtractor 216 in synchronization with a rising edge of a timing signal $TM_i$ output from the $\Sigma$ alignment unit 212, and holds the value as a time-to-digital value $TD_i$. For example, the $\Sigma$ alignment unit 212 sets the timing signal $TM_i$ to a high level when the logic value of the signal $S[0]$ changes from 0 to 1, and sets the timing signal $TM_i$ to a low level when the logic value of the signal $S[0]$ changes from 1 to 0. The time-to-digital value $TD_i$ is a value corresponding to a phase difference between the rising edge of the operating clock signal RCLK and the rising edge of the trigger signal TRG.

The integrator 218 integrates the count value $\Sigma_j$ in synchronization with the rising edge of the operating clock signal RCLK and outputs an integrated value $\Sigma A_j$. The integrated value $\Sigma A_j$ is an integrated value obtained by integrating the number of transition times of the internal state of the state transition unit 11 from when the state transition unit 11 starts the state transition by a falling edge of the trigger signal TRG to when each rising edge of the operating clock signal RCLK occurs. The integrator 218 integrates the count value $\Sigma_j$ a predetermined number of times, and initializes the integrated value $\Sigma A_j$ to 0 each time the logic value of the signal S[0] changes from 1 to 0.

The subtractor 219 outputs a value obtained by subtracting the integrated value $\Sigma A_j$ from the weight coefficient value WC.

The latch circuit 220 includes a plurality of D flip-flops, acquires the value output from the subtractor 219 in synchronization with a rising edge of a timing signal $TM_j$ output from the $\Sigma$ alignment unit 212, and holds the value as a time-to-digital value $TD_j$. For example, the $\Sigma$ alignment unit 212 sets the timing signal $TM_j$ to a high level when the logic value of the signal S[0] changes from 1 to 0, and sets the timing signal $TM_j$ to a low level when the logic value of the signal S[0] changes from 0 to 1. The time-to-digital value $TD_j$ is a value corresponding to a phase difference between the rising edge of the operating clock signal RCLK and the falling edge of the trigger signal TRG.

The TD selection unit 221 selects any one of the time-to-digital value $TD_i$ and the time-to-digital value $TD_j$ according to the trigger signal TRG, and outputs the selected value as the time-to-digital value TD. Specifically, the TD selection unit 221 selects the time-to-digital value $TD_j$ when the trigger signal TRG is at a low level, and selects the time-to-digital value $TD_i$ when the trigger signal TRG is at a high level.

FIG. 14 shows an example of a relationship among the signal S[63: 0] that changes depending on the state transition of the state transition unit 11, the count values $\Sigma_{10}'$, $\Sigma_{01}'$, $\Sigma_{10}$, $\Sigma_{01}$, $\Sigma_i$, and $\Sigma_j$, the integrated values $\Sigma A_i$ and $\Sigma A_j$, the weight coefficient value WC, and the time-to-digital values $TD_i$, $TD_j$, and TD.

The selection signal generation units 208 and 209, the $\Sigma$ calculation units 210 and 211, the $\Sigma$ alignment unit 212, and the integrators 213, 215, and 218 may operate in synchronization with the falling edge of the operating clock signal RCLK or may operate in synchronization with both the rising edge and the falling edge of the operating clock signal RCLK.

According to the frequency synthesizer 1 of the third embodiment described above, the same effects as those in the first and second embodiments can be obtained.

In the frequency synthesizer 1 according to the third embodiment, the multi-stage delay circuit provided in the state transition unit 11 performs the state transition based on two or less time events of the trigger signal TRG. That is, time required for the trigger signal TRG to propagate from an input terminal of the multi-stage delay circuit to a final output terminal, that is, delay time of the multi-stage delay circuit is shorter than one period of the trigger signal TRG. Therefore, according to the frequency synthesizer 1 of the third embodiment, since the number of transition times of the internal state of the state transition unit 11 based on each time event of the trigger signal TRG can be easily separated into the count value $\Sigma_i$ and the count value $\Sigma_j$, frequency accuracy of the synthesizer signal $S_{VCO}$ can be improved without requiring complicated calculations to calculate the time-to-digital value TD.

When the delay time of the multi-stage delay circuit is longer than ½ period of the trigger signal TRG and shorter than one period of the trigger signal TRG, the calculation unit 13 having the configuration of FIG. 13 separates the number of transition times of the internal state of the state transition unit 11 into the two count values $\Sigma_i$ and $\Sigma_j$. Extending for any integer n of 1 or more, when the delay time of the multi-stage delay circuit is longer than n/2 period of the trigger signal TRG and shorter than (n+1)/2 period of the trigger signal TRG, the calculation unit 13 may separate the number of transition times of the internal state of the state transition unit 11 into n+1 count values $\Sigma_i$ and $\Sigma_j$.

4. Fourth Embodiment

Hereinafter, for the frequency synthesizer 1 according to a fourth embodiment, the same components as those in the first to third embodiments are denoted by the same reference numerals, the description overlapping with those in the first to third embodiments is omitted or simplified, and contents different from those in the first to third embodiments will be mainly described.

In the frequency synthesizer 1 according to the fourth embodiment, similarly to the frequency synthesizer 1 according to the second or third embodiment, the time-to-digital converter 10 includes the state transition unit 11 that includes a multi-stage delay circuit, the transition state acquisition unit 12 that acquires an input signal and a plurality of output signals of the multi-stage delay circuit, and the calculation unit 13.

In the time-to-digital converter 10 according to the second or third embodiment, in the multi-stage delay circuit provided in the state transition unit 11, the trigger signal TRG sequentially propagates the plurality of delay elements 114-1 to 114-$q$, and the transition state acquisition unit 12 acquires the trigger signal TRG, which is the state information, and output signals of the delay elements 114-1 to 114-$q$. On the other hand, in the time-to-digital converter 10 according to the fourth embodiment, in the multi-stage delay circuit, the trigger signal TRG branches and propagates through a plurality of delay elements 114-1 to 114-$r$, and the transition state acquisition unit 12 acquires the trigger signal TRG, which is state information, and output signals of the delay elements 114-1 to 114-$r$. $r$ is an integer of 2 or more and greater than $q$.

In the time-to-digital converter 10 according to the fourth embodiment, configurations of the transition state acquisition unit 12 and the calculation unit 13 are the same as those in the second or third embodiment, and a configuration of the state transition unit 11 is different from those in the second and third embodiment.

Figure 15:
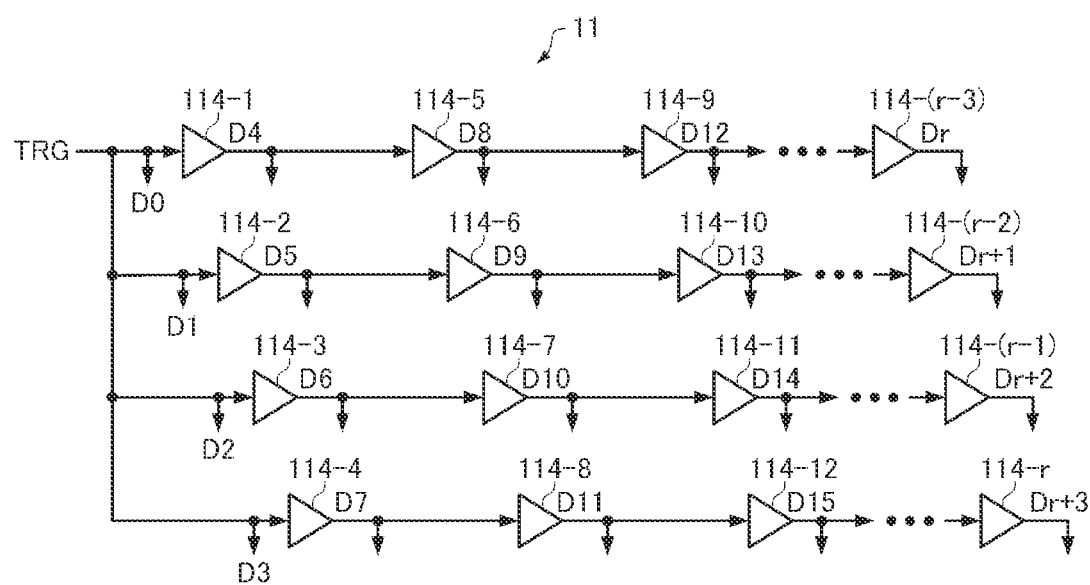
FIG. 15 is a diagram showing a configuration example of a state transition unit.
Figure 16:
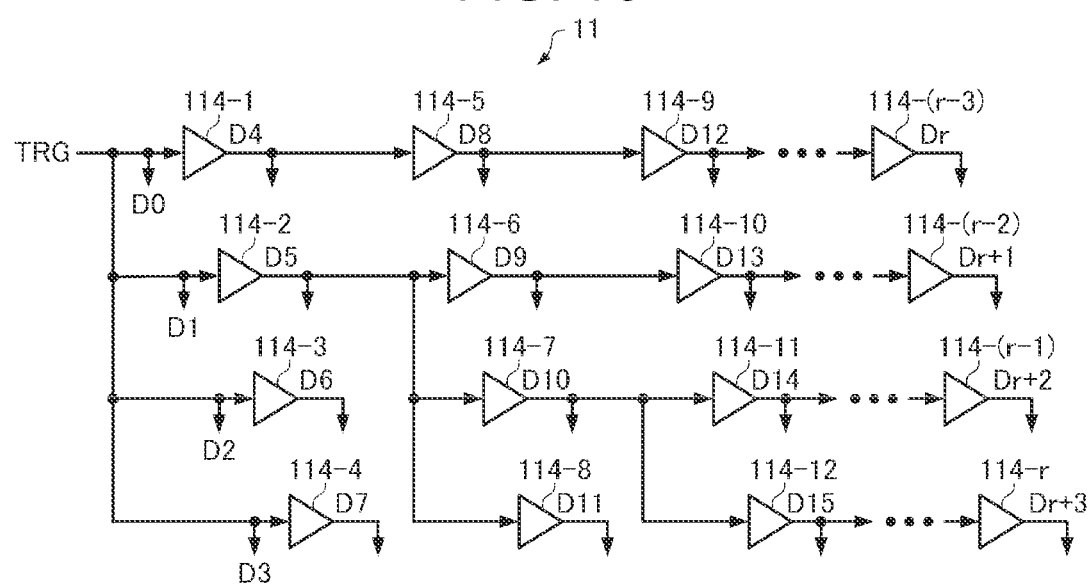
FIG. 16 is a diagram showing a configuration example of the state transition unit.
Figure 17:
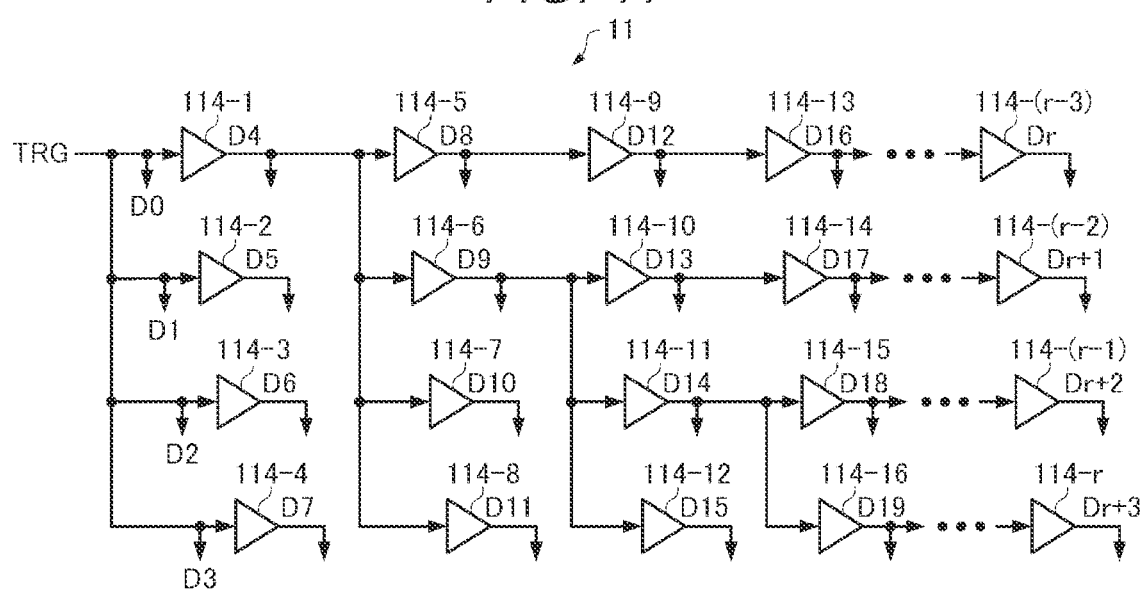
FIG. 17 is a diagram showing a configuration example of the state transition unit.

FIGS. 15, 16, and 17 are diagrams showing configuration examples of the state transition unit 11 according to the third embodiment. In the examples of FIGS. 15, 16, and 17, the multi-stage delay circuit provided in the state transition unit 11 includes $r$ delay elements 114-1 to 114-$r$. It is assumed that delay time of the delay elements 114-1 to 114-$r$ is substantially equal.

In the examples of FIGS. 15, 16, and 17, the trigger signal TRG branches and is input to four delay elements 114-1 to 114-4. Wiring lengths from a branch point to input terminals of the four delay elements 114-1 to 114-4 are different from each other, and due to a difference between these wiring delays, a time event of the trigger signal TRG first reaches the input terminal of the delay element 114-1, then reaches the input terminal of the delay element 114-2, next reaches the input terminal of the delay element 114-3, and finally reaches the input terminal of the delay element 114-4.

In the example of FIG. 15, the multi-stage delay circuit includes a signal path in which the trigger signal TRG propagates in an order of the delay element 114-1, the delay element 114-5, the delay element 114-9, . . . , and the delay element 114-($r$−3), a signal path in which the trigger signal TRG propagates in an order of the delay element 114-2, the delay element 114-6, the delay element 114-10, . . . , and the delay element 114-($r$−2), a signal path in which the trigger signal TRG propagates in an order of the delay element 114-3, the delay element 114-7, the delay element 114-11, ..., and the delay element 114-(r−1), and a signal path in which the trigger signal TRG propagates in an order of the delay element 114-4, the delay element 114-8, the delay element 114-12, ..., and the delay element 114-r.

In the example of FIG. 16, the multi-stage delay circuit includes a signal path in which the trigger signal TRG propagates in an order of the delay element 114-1, the delay element 114-5, the delay element 114-9, ..., and the delay element 114-(r−3), a signal path in which the trigger signal TRG propagates in an order of the delay element 114-2, the delay element 114-6, the delay element 114-10, ..., and the delay element 114-(r−2), a signal path in which the trigger signal TRG propagates in an order of the delay element 114-2, the delay element 114-7, the delay element 114-11, ..., and the delay element 114-(r−1), a signal path in which the trigger signal TRG propagates in an order of the delay element 114-2, the delay element 114-7, the delay element 114-12, ..., and the delay element 114-r, a signal path in which the trigger signal TRG propagates in an order of the delay element 114-2 and the delay element 114-8, a signal path in which the trigger signal TRG propagates through the delay element 114-3, and a signal path in which the trigger signal TRG propagates through the delay element 114-4.

In the example of FIG. 17, the multi-stage delay circuit includes a signal path in which the trigger signal TRG propagates in an order of the delay element 114-1, the delay element 114-5, the delay element 114-9, the delay element 114-13, ..., and the delay element 114-(r−3), a signal path in which the trigger signal TRG propagates in an order of the delay element 114-1, the delay element 114-6, the delay element 114-10, the delay element 114-14, ..., and the delay element 114-(r−2), a signal path in which the trigger signal TRG propagates in an order of the delay element 114-1, the delay element 114-6, the delay element 114-11, the delay element 114-15, ..., and the delay element 114-(r−1), a signal path in which the trigger signal TRG propagates in an order of the delay element 114-1, the delay element 114-6, the delay element 114-11, the delay element 114-16, ..., and the delay element 114-r, a signal path in which the trigger signal TRG propagates in an order of the delay element 114-1, the delay element 114-6, and the delay element 114-12, a signal path in which the trigger signal TRG propagates in an order of the delay element 114-1 and the delay element 114-7, a signal path in which the trigger signal TRG propagates in an order of the delay element 114-1 and the delay element 114-8, a signal path in which the trigger signal TRG propagates through the delay element 114-2, a signal path in which the trigger signal TRG propagates through the delay element 114-3, and a signal path in which the trigger signal TRG propagates through the delay element 114-4.

In the examples of FIGS. 15, 16, and 17, if signals of the input terminals of the delay elements 114-1 to 114-4 are denoted by D0 to D3, and the output signal of the delay element 114-j is denoted by Dj+3 for each integer j of 1 or more and r or less, when a time event of the trigger signal TRG occurs, for example, the time event occurs in an order of the signals D0, D1, D2, and Dr. That is, the signals D0 to Dr are state information indicating an internal state of the state transition unit 11, and the transition state acquisition unit 12 acquires the signals D0 to Dr which are the state information, and outputs signals S0 to Sr. Then, the calculation unit 13 calculates the time-to-digital value TD based on the signals S0 to Sr. Here, in the examples of FIGS. 15, 16, and 17, assuming that the number r of delay elements provided in the state transition unit 11 is four times the number q of delay elements provided in the state transition unit 11 of FIG. 11 or FIG. 13, the number of internal states is also four times.

The number and a branch position of the delay elements provided in the multi-stage delay circuit, the number of signal paths through which the trigger signal TRG propagates, and the like are not limited to the examples of FIGS. 15, 16, and 17, and may be appropriately selected.

According to the frequency synthesizer 1 of the fourth embodiment described above, the same effects as those in the first to third embodiments can be obtained.

In the frequency synthesizer 1 according to the fourth embodiment, since the trigger signal TRG branches and propagates through the plurality of delay elements 114-1 to 114-r in the state transition unit 11 and whereby the number of internal states of the state transition unit 11 is increased as compared with the second or third embodiment, a resolution of the state information acquired by the transition state acquisition unit 12 is improved, and accuracy of the time-to-digital value TD calculated by the calculation unit 13 is improved. Therefore, according to the frequency synthesizer 1 of the fourth embodiment, a synthesizer signal $S_{VCO}$ with high frequency accuracy as compared with the second or third embodiment can be generated based on the time-to-digital value TD output from the time-to-digital converter 10.

5. Fifth Embodiment

Hereinafter, for the frequency synthesizer 1 according to a fifth embodiment, the same components as those in the first to fourth embodiments are denoted by the same reference numerals, the description overlapping with those in the first to fourth embodiments is omitted or simplified, and contents different from those in the first to fourth embodiments will be mainly described.

Figure 18:
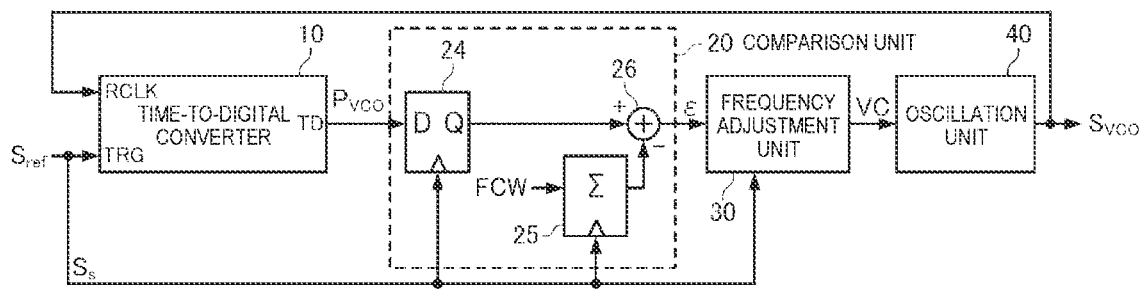
FIG. 18 is a block diagram showing a configuration example of a frequency synthesizer according to a fifth embodiment.
Figure 19:
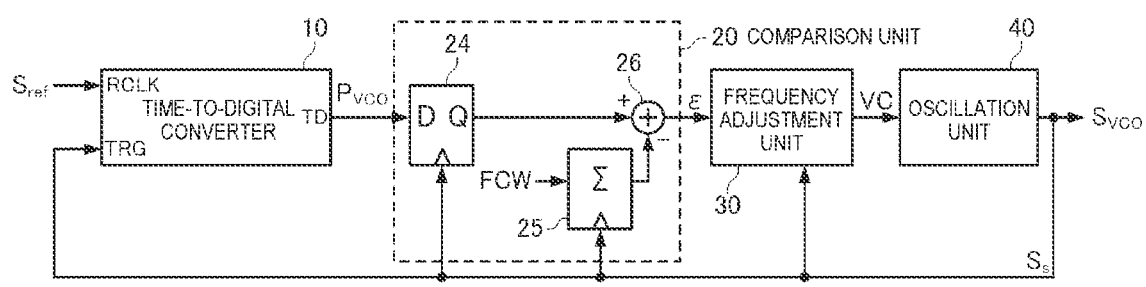
FIG. 19 is a block diagram showing another configuration example of the frequency synthesizer according to the fifth embodiment.

FIG. 18 is a block diagram showing a configuration example of the frequency synthesizer 1 according to the fifth embodiment. In addition, FIG. 19 is a block diagram showing another configuration example of the frequency synthesizer 1 according to the fifth embodiment. As shown in FIGS. 18 and 19, the frequency synthesizer 1 according to the fifth embodiment includes the time-to-digital converter 10, the comparison unit 20, the frequency adjustment unit 30, and the oscillation unit 40, as in the first to fourth embodiments.

The time-to-digital converter 10 outputs, when the reference period signal $S_{ref}$ and the synthesizer signal $S_{VCO}$ are input, and the signal having a shorter period is used as the operating clock signal RCLK and the signal having a longer period is used as the trigger signal TRG among the reference period signal $S_{ref}$ and the synthesizer signal $S_{VCO}$ output from the oscillation unit 40, the time-to-digital value TD corresponding to a time event of the trigger signal TRG with respect to the operating clock signal RCLK. The reference period signal $S_{ref}$ may be, for example, a signal input from an outside of the frequency synthesizer 1, or may be a signal generated by an oscillation circuit (not shown) of the frequency synthesizer 1.

In the example of FIG. 18, the signal having a shorter period is the synthesizer signal $S_{VCO}$ and the signal having a longer period is the reference period signal $S_{ref}$ among the reference period signal $S_{ref}$ and the synthesizer signal $S_{VCO}$. Therefore, the time-to-digital converter 10 outputs the time-to-digital value TD when the synthesizer signal $S_{VCO}$ is used as the operating clock signal RCLK and the reference period signal $S_{ref}$ is used as the trigger signal TRG. Conversely, in the example of FIG. 19, the signal having a shorter period is the reference period signal $S_{ref}$ and the signal having a longer period is the synthesizer signal $S_{VCO}$ among the reference period signal $S_{ref}$ and the synthesizer signal $S_{VCO}$. Therefore, the time-to-digital converter 10 outputs the time-to-digital value TD when the reference period signal $S_{ref}$ is used as the operating clock signal RCLK and the synthesizer signal $S_{VCO}$ is used as the trigger signal TRG.

Also in the fifth embodiment, the time-to-digital converter 10 functions as a phase detection unit that outputs a time-to-digital value TD corresponding to a phase difference between a time event of the operating clock signal RCLK and the time event of the trigger signal TRG, as in the first to fourth embodiments. A detailed configuration example of the time-to-digital converter 10 is the same as that in the first to fourth embodiments, and thus illustration and description thereof will be omitted.

The time-to-digital value TD output from the time-to-digital converter 10 is input to the comparison unit 20 as the phase signal $P_{VCO}$. The comparison unit 20 compares a value based on the time-to-digital value TD, which is the phase signal $P_{VCO}$, with a target value, and outputs the error signal ε, which is a comparison result. In the present embodiment, the comparison unit 20 compares a value holding the time-to-digital value TD with an integrated value of the set value FCW, and outputs, as a comparison result, a difference between the value holding the time-to-digital value TD and the integrated value of the set value FCW as the error signal ε. That is, in the present embodiment, the value based on the time-to-digital value TD, which is one comparison target by the comparison unit 20 is the value holding the time-to-digital value TD, and the target value, which is the other comparison target, is the integrated value of the set value FCW. The set value FCW is, for example, a value determined based on a multiplication ratio or a division ratio set in advance, may be a value of the signal input from the outside of the frequency synthesizer 1, or may be a value obtained by reading data stored in advance in a storage unit (not shown) of the frequency synthesizer 1.

As shown in FIGS. 18 and 19, for example, the comparison unit 20 includes a latch circuit 24 including a plurality of D flip-flops, an integrator 25, and a subtractor 26. The latch circuit 24 and the integrator 25 operate by using the signal having a longer period among the reference period signal $S_{ref}$ and the synthesizer signal $S_{VCO}$ as a sampling signal $S_s$. A sampling signal $S_s$ input to the latch circuit 24 and the integrator 25 is the reference period signal $S_{ref}$ in the example of FIG. 18, and is the synthesizer signal $S_{VCO}$ in the example of FIG. 19. The latch circuit 24 captures and holds the time-to-digital value TD, which is the phase signal $P_{VCO}$, in synchronization with a rising edge of the sampling signal $S_s$. The integrator 25 integrates the set value FCW in synchronization with the rising edge of the sampling signal $S_s$. The latch circuit 24 and the integrator 25 may operate in synchronization with a falling edge of the sampling signal $S_s$. The subtractor 26 outputs the error signal 2 corresponding to the difference between the value holding the time-to-digital value TD output from the latch circuit 24 and the integrated value of the set value FCW output from the integrator 25. The error signal ε is zero when the value holding the time-to-digital value TD coincides with the integrated value of the set value FCW, the error signal ε is a positive value when the value holding the time-to-digital value TD is larger than the integrated value of the set value FCW, and the error signal ε is a negative value when the value holding the time-to-digital value TD is smaller than the integrated value of the set value FCW.

The frequency adjustment unit 30 adjusts the frequency $f_{VCO}$ of the synthesizer signal $S_{VCO}$ based on the error signal ε, which is the comparison result of the comparison unit 20. In the present embodiment, the frequency adjustment unit 30 outputs the control signal VC for adjusting the frequency $f_{VCO}$ of the synthesizer signal $S_{VCO}$ based on the error signal ε.

In the present embodiment, the frequency adjustment unit 30 adjusts the frequency $f_{VCO}$ of the synthesizer signal $S_{VCO}$ based on the error signal ε such that the difference between the value holding the time-to-digital value TD and the integrated value of the set value FCW, which is the target value of the integrated value, is to be constant. The frequency adjustment unit 30 may adjust the frequency $f_{VCO}$ such that the difference between the value holding the time-to-digital value TD and the integrated value of the set value FCW is zero, or may adjust the frequency $f_{VCO}$ such that the difference between the value holding the time-to-digital value TD and the integrated value of the set value FCW is a positive or negative constant value. A detailed configuration example of the frequency adjustment unit 30 is the same as that in the first to fourth embodiments, and thus illustration and description thereof will be omitted.

The oscillation unit 40 generates the synthesizer signal $S_{VCO}$ based on the control signal VC output from the frequency adjustment unit 30. For example, the oscillation unit 40 may include a voltage-controlled oscillator (not shown) that outputs a signal of a frequency corresponding to a voltage value of the control signal VC. The oscillation unit 40 may output an output signal of the voltage-controlled oscillator as the synthesizer signal $S_{VCO}$, or may further include a frequency divider (not shown) that divides the output signal of the voltage-controlled oscillator and may output an output signal of the frequency divider as the synthesizer signal $S_{VCO}$.

In the frequency synthesizer 1 according to the fifth embodiment configured as shown in FIG. 18 or 19, the frequency adjustment unit 30 adjusts the frequency $f_{VCO}$ of the synthesizer signal $S_{VCO}$ such that the difference between the value holding the time-to-digital value TD and the integrated value of the set value FCW is to be constant, thereby forming a stable PLL in a state where a phase difference between the reference period signal $S_{ref}$ and the synthesizer signal $S_{VCO}$ is constant and the synthesizer signal $S_{VCO}$ has a desired frequency.

As described above, in the frequency synthesizer 1 according to the fifth embodiment, the time-to-digital converter 10 outputs the time-to-digital value TD corresponding to the time event of the trigger signal TRG with respect to the operating clock signal RCLK, the operating clock signal RCLK is the signal having a shorter period and the trigger signal TRG is the signal having a longer period among the reference period signal $S_{ref}$ and the synthesizer signal $S_{VCO}$. Then, the comparison unit 20 compares the value holding the time-to-digital value TD with the target value, which is the integrated value of the set value FCW, and the frequency adjustment unit 30 adjusts the frequency of the synthesizer signal $S_{VCO}$ such that the difference between the value holding the time-to-digital value TD and the target value is to be constant. Therefore, the time-to-digital converter 10 functions as a phase detection unit that detects the phase difference between the reference period signal $S_{ref}$ and the synthesizer signal $S_{VCO}$, and since the PLL is formed by the time-to-digital converter 10, the comparison unit 20, the frequency adjustment unit 30, and the oscillation unit 40, the synthesizer signal $S_{VCO}$ having a desired frequency can be output. Then, the time-to-digital converter 10 has a relatively simple configuration including the state transition unit 11, the transition state acquisition unit 12, and the calculation unit 13, and since a resolution of phase detection is improved by increasing the number of bits of the time-to-digital value TD, frequency accuracy of the synthesizer signal $S_{VCO}$ can be improved. Therefore, according to the frequency synthesizer 1 of the fifth embodiment, a synthesizer signal $S_{VCO}$ with high frequency accuracy can be output while limiting an increase in circuit scale as compared with a frequency synthesizer using a circuit in which a large number of frequency delta-sigma modulation units are provided in parallel instead of the time-to-digital converter 10.

According to the frequency synthesizer 1 of the fifth embodiment, the same effects as those in the first to fourth embodiments can be obtained.

The present disclosure is not limited to the present embodiment, and various modifications can be made within the scope of the gist of the present disclosure.

Although the embodiments and modifications are described above, the present disclosure is not limited to these embodiments, and can be implemented in various aspects without departing from the scope of the disclosure. For example, the above embodiments may be combined as appropriate.

The present disclosure includes a configuration substantially the same as the configurations described in the embodiments, for example, a configuration having the same functions, methods, and results, or a configuration having the same objects and effects. The present disclosure includes a configuration obtained by replacing a non-essential portion of the configuration described in the embodiment. The present disclosure includes a configuration having the same functions and effect as the configuration described in the embodiments, or a configuration capable of achieving the same objects. The present disclosure includes a configuration in which a known technique is added to the configuration described in the embodiments.

The following contents are derived from the embodiments and modifications described above.

A frequency synthesizer according to an aspect includes: a time-to-digital converter configured to output, when a reference period signal and a synthesizer signal are input, and a signal having a shorter period is used as an operating clock signal and a signal having a longer period is used as a trigger signal among the reference period signal and the synthesizer signal, a time-to-digital value corresponding to a time event of the trigger signal with respect to the operating clock signal; a comparison unit configured to compare a value based on the time-to-digital value output from the time-to-digital converter with a target value; an oscillation unit configured to generate the synthesizer signal; and a frequency adjustment unit configured to adjust a frequency of the synthesizer signal based on a comparison result of the comparison unit, in which the time-to-digital converter includes: a state transition unit configured to start a state transition in which an internal state transitions based on the time event of the trigger signal and output state information indicating the internal state; a transition state acquisition unit configured to acquire and hold the state information from the state transition unit in synchronization with the operating clock signal; and a calculation unit configured to calculate the time-to-digital value according to the number of transition times of the internal state based on the state information acquired by the transition state acquisition unit.

In the frequency synthesizer, the time-to-digital converter outputs the time-to-digital value corresponding to the time event of the trigger signal with respect to the operating clock signal, the operating clock signal is the signal having a shorter period and the trigger signal is the signal having a longer period among the reference period signal and the synthesizer signal. Therefore, the time-to-digital converter functions as a phase detection unit that detects a phase difference between the reference period signal and the synthesizer signal, and a synthesizer signal having a desired frequency can be output by the time-to-digital converter, the comparison unit, the frequency adjustment unit, and the oscillation unit. Then, the time-to-digital converter has a relatively simple configuration including the state transition unit, the transition state acquisition unit, and the calculation unit, and since a resolution of phase detection is improved by increasing the number of bits of the time-to-digital value, frequency accuracy of the synthesizer signal can be improved. Therefore, according to the frequency synthesizer, a signal with high frequency accuracy can be output while limiting an increase in circuit scale as compared with a frequency synthesizer using a circuit in which a large number of frequency delta-sigma modulation units are provided in parallel instead of the time-to-digital converter.

In the frequency synthesizer according to the above aspect, the comparison unit may compare a change amount of the time-to-digital value with the target value determined based on a multiplication ratio or a division ratio set in advance, and may output a difference between the change amount of the time-to-digital value and the target value as the comparison result, and the frequency adjustment unit may adjust the frequency of the synthesizer signal such that the difference is to be constant.

According to the frequency synthesizer, since an FLL is formed by the time-to-digital converter, the comparison unit, the frequency adjustment unit, and the oscillation unit, the FLL is stable in a state where the synthesizer signal has a desired frequency.

In the frequency synthesizer according to the above aspect, the comparison unit may compare a value holding the time-to-digital value with the target value determined based on a multiplication ratio or a division ratio set in advance, and may output a difference between the value holding the time-to-digital value and the target value as the comparison result, and the frequency adjustment unit may adjust the frequency of the synthesizer signal such that the difference is to be constant.

According to the frequency synthesizer, since a PLL is formed by the time-to-digital converter, the comparison unit, the frequency adjustment unit, and the oscillation unit, the PLL is stable in a state where the phase difference between the reference period signal and the synthesizer signal is constant and the synthesizer signal has a desired frequency.

In the frequency synthesizer according to the above aspect, the frequency adjustment unit may include a filter to which the difference is input, and may adjust the frequency of the synthesizer signal such that an output signal of the filter is to be constant.

According to the frequency synthesizer, since noise components are reduced by the filter, SNR of the synthesizer signal is improved.

In the frequency synthesizer according to the above aspect, the filter may include a low-pass filter, a lead filter, a lag filter, or a lag lead filter.

In the frequency synthesizer according to the above aspect, the calculation unit may calculate an integrated value obtained by integrating the number of transition times of the internal state based on the state information acquired by the transition state acquisition unit, and may calculate the time-to-digital value based on the integrated value.

According to the frequency synthesizer, since the resolution of the phase detection is improved by increasing the number of times of integration of the number of transition times of the internal state of the state transition unit in the calculation unit of the time-to-digital converter, the frequency accuracy of the synthesizer signal can be improved.

In the frequency synthesizer according to the above aspect, the calculation unit may calculate the time-to-digital value by performing a predetermined calculation on a value weighted with time and the integrated value.

In the frequency synthesizer according to the above aspect, the state transition unit may include a multi-stage delay circuit that includes a plurality of delay elements through which the trigger signal propagates and may start the state transition based on the time event of the trigger signal.

According to the frequency synthesizer, since the number of internal states of the state transition unit can be increased according to the number of delay elements, the resolution of the phase detection by the time-to-digital converter can be improved, and the frequency accuracy of the synthesizer signal can be improved.

In the frequency synthesizer according to the above aspect, the trigger signal may branch and propagate through the plurality of delay elements.

According to the frequency synthesizer, since the number of internal states of the state transition unit can be increased while keeping maximum delay time of the multi-stage delay circuit short, the frequency accuracy of the synthesizer signal can be improved without requiring complicated calculation for the calculation of the time-to-digital value.

In the frequency synthesizer according to the above aspect, the multi-stage delay circuit may perform the state transition based on two or less time events of the trigger signal.

According to the frequency synthesizer, since it is possible to easily separate the number of transitions of the internal state of the state transition unit based on the time event of each trigger signal, it is possible to increase the frequency accuracy of the synthesizer signal without requiring complicated calculation for the calculation of the time-to-digital value.

What is claimed is:

1. A frequency synthesizer comprising:
   a time-to-digital converter configured to output, when a reference period signal and a synthesizer signal are input, and a signal having a shorter period is used as an operating clock signal and a signal having a longer period is used as a trigger signal among the reference period signal and the synthesizer signal, a time-to-digital value corresponding to a time event of the trigger signal with respect to the operating clock signal;
   a comparison unit configured to compare a value based on the time-to-digital value output from the time-to-digital converter with a target value;
   an oscillation unit configured to generate the synthesizer signal; and
   a frequency adjustment unit configured to adjust a frequency of the synthesizer signal based on a comparison result of the comparison unit, wherein
   the time-to-digital converter includes:
     a state transition unit configured to start a state transition in which an internal state transitions based on the time event of the trigger signal and output state information indicating the internal state;
     a transition state acquisition unit configured to acquire and hold the state information from the state transition unit in synchronization with the operating clock signal; and
     a calculation unit configured to calculate the time-to-digital value according to the number of transition times of the internal state based on the state information acquired by the transition state acquisition unit.

2. The frequency synthesizer according to claim 1, wherein
   the comparison unit is configured to compare a change amount of the time-to-digital value with the target value determined based on a multiplication ratio or a division ratio set in advance, and output a difference between the change amount of the time-to-digital value and the target value as the comparison result, and
   the frequency adjustment unit is configured to adjust the frequency of the synthesizer signal such that the difference is to be constant.

3. The frequency synthesizer according to claim 1, wherein
   the comparison unit is configured to compare a value holding the time-to-digital value with the target value determined based on a multiplication ratio or a division ratio set in advance, and output a difference between the value holding the time-to-digital value and the target value as the comparison result, and
   the frequency adjustment unit is configured to adjust the frequency of the synthesizer signal such that the difference is to be constant.

4. The frequency synthesizer according to claim 2, wherein
   the frequency adjustment unit includes a filter to which the difference is input, and is configured to adjust the frequency of the synthesizer signal such that an output signal of the filter is to be constant.

5. The frequency synthesizer according to claim 4, wherein
   the filter includes a low-pass filter, a lead filter, a lag filter, or a lag lead filter.

6. The frequency synthesizer according to claim 1, wherein
   the calculation unit is configured to calculate an integrated value obtained by integrating the number of transition times of the internal state based on the state information acquired by the transition state acquisition unit, and calculate the time-to-digital value based on the integrated value.

7. The frequency synthesizer according to claim 6, wherein
   the calculation unit is configured to calculate the time-to-digital value by performing a predetermined calculation on a value weighted with time and the integrated value.

8. The frequency synthesizer according to claim 1, wherein
   the state transition unit includes a multi-stage delay circuit that includes a plurality of delay elements through which the trigger signal propagates and is configured to start the state transition based on the time event of the trigger signal.

9. The frequency synthesizer according to claim 8, wherein the trigger signal branches and propagates through the plurality of delay elements.

10. The frequency synthesizer according to claim 8, wherein
the multi-stage delay circuit is configured to perform the state transition based on two or less time events of the trigger signal.

\* \* \* \* \*